US011394368B2

(12) United States Patent
Nosaka

(10) Patent No.: US 11,394,368 B2
(45) Date of Patent: Jul. 19, 2022

(54) ACOUSTIC WAVE FILTER, MULTIPLEXER, RADIO FREQUENCY FRONT-END CIRCUIT, AND COMMUNICATION DEVICE

(71) Applicant: Murata Manufacturing Co., Ltd., Nagaokakyo (JP)

(72) Inventor: Koji Nosaka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 101 days.

(21) Appl. No.: 17/027,725

(22) Filed: Sep. 22, 2020

(65) Prior Publication Data

US 2021/0006232 A1   Jan. 7, 2021

Related U.S. Application Data

(63) Continuation of application No. PCT/JP2019/012298, filed on Mar. 25, 2019.

(30) Foreign Application Priority Data

Mar. 28, 2018   (JP) .............................. JP2018-063052

(51) Int. Cl.
| | |
|---|---|
| H03H 9/64 | (2006.01) |
| H03H 9/145 | (2006.01) |
| H03H 9/25 | (2006.01) |
| H03H 9/72 | (2006.01) |
| H03F 3/19 | (2006.01) |
| H04B 1/40 | (2015.01) |

(52) U.S. Cl.
CPC ............ H03H 9/6483 (2013.01); H03F 3/19 (2013.01); H03H 9/145 (2013.01); H03H 9/25 (2013.01);

(Continued)

(58) Field of Classification Search
CPC .. H03H 9/0009; H03H 9/0014; H03H 9/0028; H03H 9/0047; H03H 9/0052;
(Continued)

(56) References Cited

U.S. PATENT DOCUMENTS

| 2014/0049340 A1* | 2/2014 | Inoue .................. H03H 9/6483 333/195 |
| 2016/0105158 A1* | 4/2016 | Fujiwara .............. H03H 9/6483 333/133 |
| 2016/0285431 A1* | 9/2016 | Nakahashi ......... H03H 9/14541 |

FOREIGN PATENT DOCUMENTS

| JP | 06-152299 A | 5/1994 |
| JP | 2008-079227 A | 4/2008 |

(Continued)

OTHER PUBLICATIONS

English Translation of the Written Opinion dated May 28, 2019 for PCT/JP2019/012298 filed on Mar. 25, 2019, 7 pages.
(Continued)

*Primary Examiner* — Young T. Tse
(74) *Attorney, Agent, or Firm* — Xsensus LLP

(57) ABSTRACT

A filter includes: a series-arm resonator; and a parallel-arm resonator. The series-arm resonator and the parallel-arm resonator each include: an interdigital transducer (IDT) electrode formed on a substrate and including a plurality of electrode fingers; and a protective film. The protective film included in the parallel-arm resonator is thinner than the protective film included in the series-arm resonator. The parallel-arm resonator has a first fractional bandwidth ((the higher-order resonance frequency–the resonant frequency)/the resonant frequency) greater than the first fractional bandwidth of the series-arm resonator. The parallel-arm resonator has a second fractional bandwidth ((the higher-order antiresonant frequency–the antiresonant frequency)/the antiresonant frequency) greater than the second fractional bandwidth of the series-arm resonator.

20 Claims, 22 Drawing Sheets

(52) U.S. Cl.
CPC ............... *H03H 9/72* (2013.01); *H04B 1/40* (2013.01); *H03F 2200/451* (2013.01)

(58) Field of Classification Search
CPC .... H03H 9/0066; H03H 9/008; H03H 9/0085; H03H 9/0095; H03H 9/02228; H03H 9/02543; H03H 9/02566; H03H 9/02574; H03H 9/022992; H03H 9/145; H03H 9/46; H03H 9/64; H03H 9/6409; H03H 9/6413; H03H 9/6416; H03H 9/6479; H03H 9/6483; H03H 9/70; H03H 2009/0019; H03F 3/19
USPC ........ 375/219, 220, 259; 370/277, 278, 282; 455/39, 500, 73, 88, 292, 339; 708/316, 708/317
See application file for complete search history.

(56) References Cited

FOREIGN PATENT DOCUMENTS

| | | | |
|---|---|---|---|
| JP | 2017-228882 A | 12/2017 | |
| WO | 2011/040332 A1 | 4/2011 | |
| WO | 2012/098816 A1 | 7/2012 | |
| WO | 2018/052073 A1 | 3/2018 | |
| WO | WO-2018037968 A1 * | 3/2018 | ........... H03H 7/0161 |
| WO | WO-2018051846 A1 * | 3/2018 | ......... H03H 9/02637 |

OTHER PUBLICATIONS

International Search Report and Written Opinion dated May 28, 2019 for PCT/JP2019/012298 filed on Mar. 25, 2019, 10 pages including English Translation of the International Search Report.

* cited by examiner

ACOUSTIC WAVE FILTER, MULTIPLEXER, RADIO FREQUENCY FRONT-END CIRCUIT, AND COMMUNICATION DEVICE

CROSS REFERENCE TO RELATED APPLICATIONS

This is a continuation application of PCT International Application No. PCT/JP2019/012298 filed on Mar. 25, 2019, designating the United States of America, which is based on and claims priority of Japanese Patent Application No. 2018-063052 filed on Mar. 28, 2018. The entire disclosures of the above-identified applications, including the specifications, drawings and claims are incorporated herein by reference in their entirety.

FIELD

The present disclosure relates to an acoustic wave filter that includes acoustic wave resonators, a multiplexer, a radio frequency front-end circuit, and a communication device.

BACKGROUND

Conventionally, acoustic wave filters that use acoustic waves have been widely used as, for instance, bandpass filters disposed in front end portions of mobile communication devices. Radio frequency front-end circuits each including a plurality of acoustic wave filters have been put into practical use in order to support multiplex technology such as multi-mode and multiband technology.

For example, Japanese Unexamined Patent Application Publication No. H6-152299 describes forming a protective film (a dielectric) that covers an interdigital transducer (IDT) electrode included in an acoustic wave resonator in an acoustic wave filter that supports multiband technology, in order to improve temperature characteristics.

SUMMARY

Technical Problems

However, as recognized by the present inventor, the acoustic wave filter described in Japanese Unexamined Patent Application Publication No. H6-152299 has problems that if the protective film is thick, a higher-order mode response increases at a frequency higher than a resonant frequency and an antiresonant frequency, and the attenuation at frequencies higher than the passband of the acoustic wave filter decreases.

In view of the foregoing, the present disclosure provides an acoustic wave filter, a multiplexer, a radio frequency front-end circuit, and a communication device in each of which attenuation characteristics at frequencies higher than the passband are improved.

Solutions

In order to provide such an acoustic wave filter, an acoustic wave filter according to an aspect of the present disclosure is an acoustic wave filter including: a first input/output terminal through which radio frequency signals are input and output; a second input/output terminal through which radio frequency signals are input and output; a series-arm resonant circuit that includes a first acoustic wave resonator, the series-arm resonant circuit being disposed on a first path that connects the first input/output terminal and the second input/output terminal, the first acoustic wave resonator being an acoustic wave resonator; and a parallel-arm resonant circuit that includes a second acoustic wave resonator, the parallel-arm resonant circuit being disposed on a second path that connects a node on the first path and a ground, the second acoustic wave resonator being an acoustic wave resonator. The first acoustic wave resonator and the second acoustic wave resonator each include: an interdigital transducer (IDT) electrode formed on a substrate and including a plurality of electrode fingers, the substrate being at least partially piezoelectric; and a protective film covering the IDT electrode. The protective film included in the second acoustic wave resonator is thinner than the protective film included in the first acoustic wave resonator. The first acoustic wave resonator has a higher-order mode resonance frequency and a higher-order mode antiresonant frequency that are higher than an antiresonant frequency of the first acoustic wave resonator. The second acoustic wave resonator has a higher-order mode resonance frequency and a higher-order mode antiresonant frequency that are higher than an antiresonant frequency of the second acoustic wave resonator. Under a condition, applicable to each of the acoustic wave resonators, that a value obtained by dividing a difference between the higher-order mode resonance frequency and a resonant frequency of the acoustic wave resonator by the resonant frequency of the acoustic wave resonator is defined as a first fractional bandwidth, and a value obtained by dividing a difference between the higher-order mode antiresonant frequency and the antiresonant frequency of the acoustic wave resonator by the antiresonant frequency of the acoustic wave resonator is defined as a second fractional bandwidth, the first fractional bandwidth of the second acoustic wave resonator is greater than the first fractional bandwidth of the first acoustic wave resonator, and the second fractional bandwidth of the second acoustic wave resonator is greater than the second fractional bandwidth of the first acoustic wave resonator.

According to the above configuration, the protective film in the second acoustic wave resonator is thinner, and thus a difference between the higher-order antiresonant frequency of the first acoustic wave resonator and the higher-order resonance frequency of the second acoustic wave resonator can be decreased. Accordingly, a higher-order mode response can be decreased, and attenuation characteristics at frequencies higher than the passband can be improved.

A difference between the higher-order mode antiresonant frequency of the first acoustic wave resonator and the higher-order mode resonance frequency of the second acoustic wave resonator may be smaller than a difference between the antiresonant frequency of the first acoustic wave resonator and the resonant frequency of the second acoustic wave resonator.

A difference between the higher-order antiresonant frequency of the first acoustic wave resonator and the higher-order resonance frequency of the second acoustic wave resonator is made smaller than a difference between the antiresonant frequency of the first acoustic wave resonator and the resonant frequency of the second acoustic wave resonator, and thus a frequency domain in which a higher-mode response occurs can be narrowed.

The parallel-arm resonant circuit may further include an impedance circuit for changing a passband of the acoustic wave filter, the impedance circuit being connected to the second acoustic wave resonator, and the impedance circuit may include: a capacitive element connected to the second acoustic wave resonator; and a switch element connected in parallel to the capacitive element, between the second acoustic wave resonator and the ground.

Accordingly, this achieves an attenuation pole at a frequency lower than the passband can be shifted according to on and off of the switch element, and thus a frequency-tunable acoustic wave filter that changes the passband.

The parallel-arm resonant circuit may further include a third acoustic wave resonator, the third acoustic wave resonator being an acoustic wave resonator, the third acoustic wave resonator may be connected, between the node and the ground, in parallel to a circuit in which the second acoustic wave resonator and the impedance circuit are connected in series, and the third acoustic wave resonator may have a resonant frequency different from the resonant frequency of the second acoustic wave resonator, and an antiresonant frequency different from the antiresonant frequency of the second acoustic wave resonator.

Accordingly, this achieves a tunable filter that can shift at least one of an attenuation pole at a frequency lower than the passband or an attenuation pole at a frequency higher than the passband.

The resonant frequency of the third acoustic wave resonator may be lower than the resonant frequency of the second acoustic wave resonator, the antiresonant frequency of the third acoustic wave resonator may be lower than the antiresonant frequency of the second acoustic wave resonator, and the impedance circuit may be connected in series to only the second acoustic wave resonator out of the second acoustic wave resonator and the third acoustic wave resonator.

Accordingly, the passband can be shifted to higher frequencies without making the slope at frequencies lower than the passband gentle, while shifting the attenuation pole at a frequency higher than the passband to a higher frequency.

The resonant frequency of the third acoustic wave resonator may be higher than the resonant frequency of the second acoustic wave resonator, the antiresonant frequency of the third acoustic wave resonator may be higher than the antiresonant frequency of the second acoustic wave resonator, and the impedance circuit may be connected in series to only the second acoustic wave resonator out of the second acoustic wave resonator and the third acoustic wave resonator.

Accordingly, this achieves a tunable filter that can shift the passband to higher frequencies without making the slope at frequencies lower than the passband gentle, while shifting the attenuation pole at a frequency lower than the passband to a higher frequency.

The parallel-arm resonant circuit may further include a third acoustic wave resonator, and the impedance circuit may be connected in series to a circuit in which the second acoustic wave resonator and the third acoustic wave resonator are connected in parallel.

Accordingly, this achieves a tunable filter that can shift both the attenuation pole at a frequency lower than and the attenuation pole at a frequency higher than the passband to higher frequencies.

The impedance circuit may be connected in series to only one of the second acoustic wave resonator and the third acoustic wave resonator, and the parallel-arm resonant circuit may further include, between the node and the ground, another impedance circuit connected in series to only another of the second acoustic wave resonator and the third acoustic wave resonator.

Accordingly, the passband can be shifted to higher frequencies without making the slopes at frequencies higher and lower than the passband gentle, while shifting the attenuation poles at frequencies higher and lower than the passband to higher frequencies. Thus, this achieves a tunable filter that can shift the center frequency while maintaining the bandwidth, for example.

The impedance circuit may further include an inductor connected in series to the switch element, and a circuit in which the switch element and the inductor are connected in series may be connected in parallel to the capacitive element.

Accordingly, this achieves a tunable filter having a passband whose frequency range can be widely changed.

A multiplexer according to an aspect of the present disclosure includes: the acoustic wave filter as described above; and a first filter connected to the first input/output terminal. A passband of the first filter has a frequency range at least partially higher than a frequency range of a passband of the acoustic wave filter, and the higher-order mode resonance frequency of the first acoustic wave resonator and the higher-order mode antiresonant frequency of the second acoustic wave resonator are higher than a frequency at a higher-frequency edge of the passband of the first filter.

Accordingly, this achieves a multiplexer in which insertion loss in the passband of the first filter is decreased.

The multiplexer may further include: a second filter connected to the first input/output terminal. A passband of the second filter may have a frequency range at least partially higher than the frequency range of the passband of the first filter, and the higher-order mode resonance frequency of the first acoustic wave resonator and the higher-order mode antiresonant frequency of the second acoustic wave resonator may be lower than a frequency at a lower-frequency edge of the passband of the second filter.

Accordingly, this achieves a multiplexer in which insertion loss in the passband of the first filter and insertion loss in the passband of the second filter are decreased.

A radio frequency front-end circuit according to an aspect of the present disclosure includes: the acoustic wave filter as described above; and an amplifier circuit connected to the acoustic wave filter.

Accordingly, this provides a radio frequency front-end circuit that includes an acoustic wave filter whose attenuation characteristics at frequencies higher than the passband are improved.

A communication device according to an aspect of the present disclosure includes: a radio frequency (RF) signal processing circuit configured to process a radio frequency signal to be transmitted by an antenna element and a radio frequency signal received by the antenna element; and the above-described radio frequency front-end circuit configured to transfer the radio frequency signals between the antenna element and the RF signal processing circuit.

Accordingly, this provides a communication device that includes an acoustic wave filter whose attenuation characteristics at frequencies higher than the passband are improved.

Advantageous Effects

According to the present disclosure, an acoustic wave filter, a multiplexer, a radio frequency front-end circuit, and a communication device in each of which attenuation characteristics at frequencies higher than the passband are improved can be provided.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 6A is a graph illustrating passing characteristics of the filter according to Embodiment 1 (the example) when the switches are on.

FIG. 7A is a graph illustrating passing characteristics of a filter according to a comparative example when switches are on.

FIG. 8A is a graph illustrating a comparison of passing characteristics of the filters according to the example and the comparative example when the switches are on.

DESCRIPTION OF EMBODIMENTS

Figure 1:
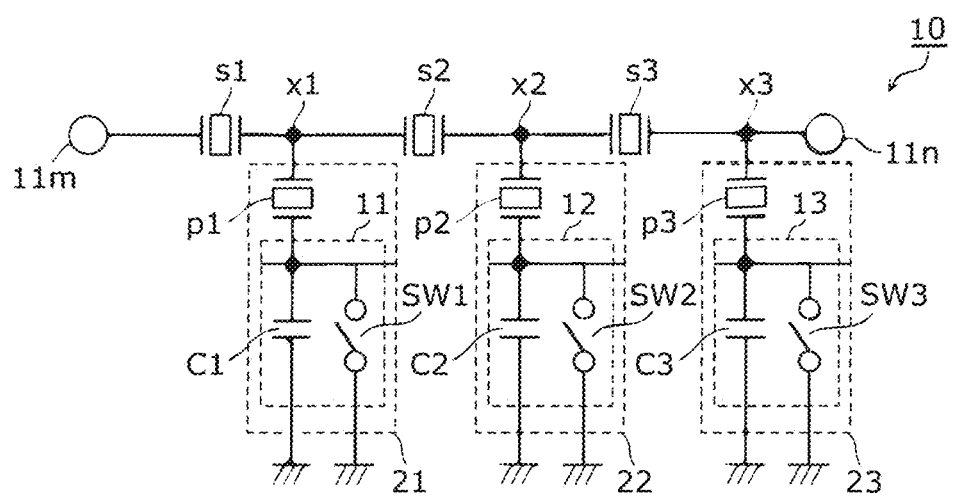
FIG. 1 illustrates a circuit configuration of a filter according to Embodiment 1.

The following describes in detail embodiments of the present disclosure, using examples and drawings. Note that the embodiments described below each show a general or specific example. The numerical values, shapes, materials, elements, the arrangement and connection of the elements, and others indicated in the following embodiments are mere examples, and therefore are not intended to limit the present disclosure. Thus, among the elements in the following embodiments, elements not recited in any of the independent claims are described as arbitrary elements. In addition, the sizes of elements and the ratios of the sizes illustrated in the drawings are not necessarily accurate. Throughout the drawings, the same numeral is given to substantially the same element, and redundant description is omitted or simplified in some cases.

Embodiment 1

[1.1 Circuit Configuration of Filter 10]

FIG. 1 illustrates a circuit configuration of filter 10 according to Embodiment 1. Filter 10 is a radio frequency filter circuit disposed in a front end portion of a mobile phone that supports multi-mode/multiband technology, for example. Filter 10 is disposed in, for example, a front end circuit of, for instance, a mobile phone that supports Long Term Evolution (LTE), allows a radio frequency signal of a band (a frequency band) determined by the Third Generation Partnership Project (3GPP) to pass through, and filters (attenuates) a spurious radio frequency signal that affects communication. Filter 10 is an acoustic wave filter having a function of changing the frequency ranges of a passband and attenuation bands, using acoustic wave resonators.

As illustrated in FIG. 1, filter 10 includes series-arm resonators s1, s2, and s3, parallel-arm resonators p1, p2, and p3, and impedance circuits 11, 12, and 13.

Series-arm resonators s1, s2, and s3 are first acoustic wave resonators connected between input/output terminal 11m (a first input/output terminal) and input/output terminal 11n (a second input/output terminal). Series-arm resonators s1, s2, and s3 each constitute a series-arm resonant circuit disposed on a first path that connects input/output terminals 11m and 11n. Note that the series-arm resonant circuits are not limited to circuits constituted by only series-arm resonators s1, s2, and s3, and may each include one or more acoustic wave resonators. In the present embodiment, the series-arm resonant circuits each include a single acoustic wave resonator, but may include a plurality of acoustic wave resonators. Examples of a series-arm resonant circuit that includes a plurality of acoustic wave resonators include a longitudinally coupled resonator constituted by a plurality of acoustic wave resonators, and a plurality of split resonators resulting from one acoustic wave resonator being serially split, for instance. For example, filter characteristics for which power durability is to be increased can be achieved by using, as a series-arm resonant circuit, a plurality of split resonators resulting from one acoustic wave resonator being serially split, for instance, and filter characteristics for which attenuation, for instance, is to be increased can be achieved by using a longitudinally coupled resonator as a series-arm resonant circuit.

Parallel-arm resonator p1 is a second acoustic wave resonator connected between node x1 on the first path and the ground (a reference terminal). Parallel-arm resonator p2 is a second acoustic wave resonator connected between node x2 on the first path and the ground (a reference terminal). Parallel-arm resonator p3 is a second acoustic wave resonator connected between node x3 on the first path and the ground (a reference terminal). Note that node x1 is a connection node of series-arm resonators s1 and s2, node x2 is a connection node of series-arm resonators s2 and s3, and node x3 is a connection node of series-arm resonator s3 and input/output terminal 11n.

Parallel-arm resonators p1, p2, and p3 each have a resonant frequency lower than the passband of filter 10 and an antiresonant frequency in the passband, and series-arm resonators s1, s2, and s3 each have a resonant frequency in the passband and an antiresonant frequency higher than the passband. Thus, in the present embodiment, the resonant frequencies of parallel-arm resonators p1, p2, and p3 are lower than the resonant frequencies of series-arm resonators s1, s2, and s3, and the antiresonant frequencies of parallel-arm resonators p1, p2, and p3 are lower than the antiresonant frequencies of series-arm resonators s1, s2, and s3.

Herein, the resonant frequency of a resonator is a frequency at a "resonance point" that is a singular point at which impedance of the resonator has a local minimum value (a point at which impedance is ideally 0). The antiresonant frequency of a resonator is a frequency at an "antiresonance point" that is a singular point at which impedance of the resonator has a local maximum value (a point at which impedance is ideally infinite). Note that in the following, for convenience, not only for a resonator alone but also for a circuit that includes a plurality of resonators or a circuit that includes a resonator and an impedance element, a singular point at which impedance has a local minimum value (a point at which impedance is ideally 0) is referred to as the "resonance point", and a frequency at the resonance point is referred to as a "resonant frequency". Furthermore, a singular point at which impedance has a local maximum value (a point at which impedance is ideally infinite) is referred to as an "antiresonance point", and a frequency at the antiresonance point is referred to as an "antiresonant frequency".

More specifically, the resonant frequency of a resonator described above indicates a fundamental mode resonant frequency of the resonator, and the antiresonant frequency of the resonator described above indicates a fundamental mode antiresonant frequency of the resonator. In contrast, a higher-order resonance frequency that is a higher-order mode resonant frequency is at a local minimum point at which impedance is the second highest after impedance at the fundamental mode resonant frequency in a frequency range higher than the fundamental mode resonant frequency, and is defined as a frequency at the local minimum point. Furthermore, a higher-order antiresonant frequency that is a higher-order mode antiresonant frequency is at a local maximum point at which impedance is the second lowest after the impedance at the fundamental mode antiresonant frequency in a frequency range higher than the fundamental mode antiresonant frequency, and is defined as a frequency at the local maximum point.

In the present embodiment, parallel-arm resonators p1, p2, and p3 each include one acoustic wave resonator. However, parallel-arm resonators p1, p2, and p3 may each include a plurality of split resonators resulting from one acoustic wave resonator being serially split, for instance.

With the above configuration, series-arm resonators s1, s2, and s3 and parallel-arm resonators p1, p2, and p3 form the passband of filter 10.

Impedance circuit 11 includes capacitive element C1 connected to parallel-arm resonator p1, and switch SW1, and changes the passband of filter 10 and the attenuation band lower than the passband. Parallel-arm resonator p1 and impedance circuit 11 are included parallel-arm resonant circuit 21 disposed on a second path that connects node x1 and the ground. Impedance circuit 12 includes capacitive element C2 connected to parallel-arm resonator p2, and switch SW2, and changes the passband of filter 10 and the attenuation band lower than the passband. Parallel-arm resonator p2 and impedance circuit 12 are included in parallel-arm resonant circuit 22 disposed on the second path. Impedance circuit 13 includes capacitive element C3 connected to parallel-arm resonator p3, and switch SW3, and changes the passband of filter 10 and the attenuation band lower than the passband. Parallel-arm resonator p3 and impedance circuit 13 are included in parallel-arm resonant circuit 23 disposed on the second path. In the present embodiment, parallel-arm resonator p1 is connected to node x1, parallel-arm resonator p2 is connected to node x2, parallel-arm resonator p3 is connected to node x3, and impedance circuits 11, 12, and 13 are connected to the ground. Nevertheless, the order in which parallel-arm resonators p1, p2, and p3 and impedance circuits 11, 12, and 13 are connected is not limited to the above order, and may be opposite to the above connection order.

The following gives description, assuming that switch elements are ideal elements that have zero impedance when conducting (in an on state), and have infinite impedance when non-conducting (in an off state). In practice, a switch element has a capacitance component when in the off state, and an inductor component and a parasitic component such as a resistance component when in the on state, and thus has characteristics slightly different from characteristics of a switch element that is an ideal element.

Capacitive element C1 is connected between node x1 and the ground (the reference terminal). Capacitive element C2 is connected between node x2 and the ground (the reference terminal). Capacitive element C3 is connected between node x3 and the ground (the reference terminal). More specifically, parallel-arm resonator p1 and capacitive element C1 are connected in series, and connected between node x1 and the ground, parallel-arm resonator p2 and capacitive element C2 are connected in series, and connected between node x2 and the ground, and parallel-arm resonator p3 and capacitive element C3 are connected in series, and connected between node x3 and the ground. Specifically, parallel-arm resonator p1 is connected to node x1, parallel-arm resonator p2 is connected to node x2, parallel-arm resonator p3 is connected to node x3, and capacitive elements C1, C2, and C3 are each connected to the ground.

Switch SW1 is a switch element connected in parallel to capacitive element C1, and includes one terminal connected to the connection node of parallel-arm resonator p1 and capacitive element C1, and another terminal connected to the ground. Switch SW2 is a switch element connected in parallel to capacitive element C2, and includes one terminal connected to the connection node of parallel-arm resonator p2 and capacitive element C2, and another terminal connected to the ground. Switch SW3 is a switch element connected in parallel to capacitive element C3, and includes one terminal connected to the connection node of parallel-arm resonator p3 and capacitive element C3, and another terminal connected to the ground. With the above connecting configuration, switches SW1 to SW3 are turned on (conducting) and off (non-conducting) according to a control signal from, for instance, a controller such as an RF signal processing circuit (RFIC: radio frequency integrated circuit), for example. Impedance circuits 11, 12, and 13 change the resonant frequencies of parallel-arm resonant circuits 21, 22, and 23, according to on-off operation of switches SW1 to SW3.

For example, switches SW1 to SW3 each include a field effect transistor (FET) switch made of GaAs or complementary metal oxide semiconductor (CMOS), or a diode switch, in order to achieve size reduction.

In the present embodiment, impedance circuits 11, 12, and 13 are connected in series to the second acoustic wave resonators (parallel-arm resonators p1, p2, and p3 in the present embodiment) on the second path. Impedance circuits 11 to 13 are disposed, so that filter 10 operates as a tunable (frequency-tunable) filter that can switch between a passband and an attenuation band lower than the passband according to on and off of switches SW1 to SW3.

Thus, filter 10 has a ladder filter structure which includes six acoustic wave resonators, and in which a unit circuit that includes series-arm resonator s1 (a series-arm resonant circuit) and parallel-arm resonant circuit 21, a unit circuit that includes series-arm resonator s2 (a series-arm resonant circuit) and parallel-arm resonant circuit 22, and a unit circuit that includes series-arm resonator s3 (a series-arm resonant circuit) and parallel-arm resonant circuit 23 are cascaded.

With the above configuration, when switches SW1 to SW3 are off in filter 10, the attenuation pole at a frequency lower than the passband shifts to a higher frequency, as compared with filter 10 in which switches SW1 to SW3 are on. Accordingly, filter 10 operates as a frequency-tunable filter having a passband whose lower-frequency edge can be changed. "Passband" refers to, for example, 3 dB points of the filter 10. In addition to the passband being frequency-tunable, the skirts of the filter are also controllably adjustable.

In filter 10 according to the present embodiment, series-arm resonators s1, s2, and s3, and parallel-arm resonators p1, p2, and p3 each include an interdigital transducer (IDT) electrode that is formed on an at least partially piezoelectric substrate and includes a plurality of electrode fingers, and a protective film covering the IDT electrode. Note that the piezoelectric substrate is a substrate at least having a piezoelectric surface. For example, the substrate may have a piezoelectric thin film on the surface, and include a stacked structure in which a film having an acoustic velocity different from the acoustic velocity of the piezoelectric thin film, and a support substrate are stacked. The substrate may include, for example, a stacked structure that includes a high acoustic velocity support substrate, and a piezoelectric thin film formed on the high acoustic velocity support substrate, a stacked structure that includes a high acoustic velocity support substrate, a low acoustic velocity film formed on the high acoustic velocity support substrate, and a piezoelectric thin film formed on the low acoustic velocity film, or a stacked structure that includes a support substrate, a high acoustic velocity film formed on the support substrate, a low acoustic velocity film formed on the high acoustic velocity film, and a piezoelectric thin film formed on the low acoustic velocity film. Note that the substrate may be entirely piezoelectric. The protective film covering the IDT electrode may be constituted by, for example, a dielectric or an insulator made of $SiO_2$ or SiN, for instance, or may include a stacked structure in which the dielectric and the insulator are stacked.

Herein, the protective films of parallel-arm resonators p1, p2, and p3 are thinner than the protective films of series-arm resonators s1, s2, and s3. Accordingly, the interval between a fundamental mode resonant frequency and a higher-order mode resonance frequency of each of parallel-arm resonators p1, p2, and p3 is greater than an interval between a fundamental mode resonant frequency and a higher-order mode resonance frequency of each of series-arm resonators s1, s2 and s3.

Herein, a value obtained by dividing a difference between a higher-order resonance frequency and a resonant frequency of an acoustic wave resonator by the resonant frequency of the acoustic wave resonator is defined as a first fractional bandwidth, and a value obtained by dividing a difference between a higher-order antiresonant frequency and an antiresonant frequency of an acoustic wave resonator by the antiresonant frequency of the acoustic wave resonator is defined as a second fractional bandwidth. In this case, the first fractional bandwidths of parallel-arm resonators p1, p2, and p3 are greater than the first fractional bandwidths of series-arm resonators s1, s2, and s3, and the second fractional bandwidths of parallel-arm resonators p1, p2, and p3 are greater than the second fractional bandwidths of series-arm resonators s1, s2, and s3. Accordingly, the higher-order antiresonant frequencies of series-arm resonators s1, s2, and s3 and the higher-order resonance frequencies of parallel-arm resonators p1, p2, and p3 can be brought close to one another, and thus attenuation characteristics in a higher-order mode resonance occurring frequency band (an attenuation band higher than the passband) can be improved.

Note that filter 10 according to the present embodiment is a ladder filter circuit which includes six acoustic wave resonators and in which unit circuits each including one series-arm resonator and one parallel-arm resonator are cascaded in three stages. However, the filter (the acoustic wave filter) according to the present disclosure may include at least a unit circuit in one stage.

Filter 10 according to the present embodiment is a frequency-tunable filter in which impedance circuits 11 to 13 are added, yet the acoustic wave filter according to the present disclosure may be a filter which does not have a frequency-tunable function, and in which switches SW1 to SW3 or impedance circuits 11 to 13 are not included. Note that when switches SW1 to SW3 are not included, characteristics are equivalent to those exhibited when switches SW1 to SW3 are off, and when impedance circuits 11 to 13 are not included, characteristics are equivalent to those exhibited when switches SW1 to SW3 are on.

Figure 2A:
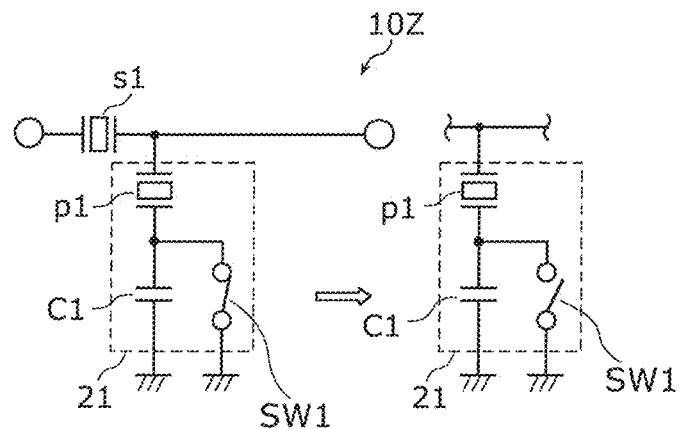
FIG. 2A illustrates unit circuits showing the on-off operation of switches of the filter.

FIG. 2A illustrates unit circuits showing the on-off operation of switches of filter 10Z according to a variation of Embodiment 1. As illustrated in FIG. 2A, filter 10Z includes series-arm resonator s1, parallel-arm resonator p1, capacitive element C1, and switch SW1. Capacitive element C1 and switch SW1 are included in an impedance circuit, and are included in a parallel-arm resonant circuit together with parallel-arm resonator p1. Here, the protective film of parallel-arm resonator p1 is thinner than the protective film of series-arm resonator s1. Accordingly, the interval between the resonant frequency and the higher-order resonance frequency of parallel-arm resonator p1 is greater than the interval between the resonant frequency and the higher-order resonance frequency of series-arm resonator s1. Hence, the higher-order antiresonant frequency of series-arm resonator s1 and the higher-order resonance frequency of parallel-arm resonator p1 can be brought close to each other, and thus attenuation characteristics in a higher-order mode resonance occurring frequency band (an attenuation band higher than the passband) can be improved.

Note that insertion loss in the passband, the steepness of slopes outside the passband, and the attenuation in attenuation bands change depending on the number of stages of connected unit circuits described above. For example, insertion loss in the passband increases with the number of stages of connected unit circuits described above, yet the steepness of slopes outside the passband and the attenuation in the attenuation bands can be ensured. Thus, the number of stages of connected unit circuits described above may be appropriately set in the filter (the acoustic wave filter) according to the present disclosure, according to the requirement specification of filter characteristics.

[1.2 Attenuation Characteristics of Filter]

Here, a problem of attenuation characteristics of a filter is to be described.

Figure 2B:
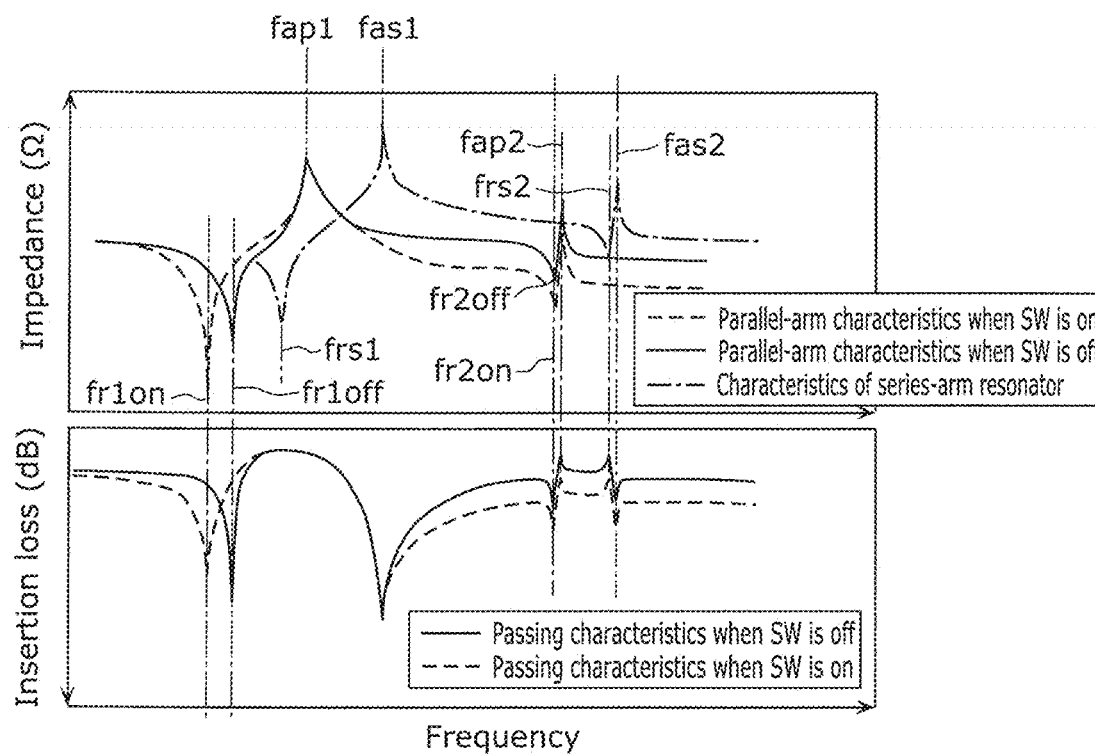
FIG. 2B is a graph illustrating attenuation characteristics of a conventional filter.

FIG. 2B is a graph illustrating attenuation characteristics of a filter according to a comparative example. Note that the filter according to the comparative example has a similar circuit configuration to that of filter 10Z illustrated in FIG. 2A, and the protective film of parallel-arm resonator p1 and the protective film of series-arm resonator s1 have the same thickness.

Due to the resonance characteristics in the upper diagram in FIG. 2B, parallel-arm resonator p1 has a fundamental mode resonant frequency lower than the passband of the filter, and a fundamental mode antiresonant frequency within the passband. The resonant frequency of parallel-arm resonator p1 is lower than the resonant frequency of series-arm resonator s1, and the antiresonant frequency of parallel-arm resonator p1 is lower than the antiresonant frequency of series-arm resonator s1.

In the filter according to the comparative example, impedance characteristics of parallel-arm resonant circuit 21 are not influenced by capacitive element C1 in a state where switch SW1 is on. Specifically, in such a state, impedance characteristics of parallel-arm resonator p1 alone are impedance characteristics of parallel-arm resonant circuit 21. On the other hand, impedance characteristics of parallel-arm resonant circuit 21 are influenced by capacitive element C1 in a state where switch SW1 is off. Specifically, in such a state, combined characteristics of parallel-arm resonator p1 and capacitive element C1 are impedance characteristics of parallel-arm resonant circuit 21.

As illustrated in FIG. 2B, parallel-arm resonant circuit 21 has two resonant frequencies fr1on and fr1off, and one antiresonant frequency fap1 (fr1on<fr1off is satisfied at this time). Here, the reason for fr1on<fr1off being satisfied is that capacitive element C1 exerts influence of the impedance in a frequency range near the resonant frequency of parallel-arm resonator p1, by switching switch SW1 from on to off. Note that antiresonant frequency fap1 matches the antiresonant frequency of parallel-arm resonator p1 alone both when switch SW1 is on and off.

Accordingly, in the filter according to the comparative example, if switch SW1 is switched from on to off, the antiresonant frequency of parallel-arm resonant circuit 21 is not shifted, and only the resonant frequency thereof shifts to a higher frequency (from fr1on to fr1off).

Furthermore, in the acoustic wave filter, it is necessary to increase a resonance bandwidth (between the antiresonant frequency and the resonant frequency) of an acoustic wave resonator in order to ensure a frequency tunable width, yet a parallel-arm resonant circuit that includes such an acoustic wave resonator and a series-arm resonator each have a higher-order mode resonance frequency higher than the passband, in addition to a resonant frequency and an antiresonant frequency that form a passband. As illustrated in FIG. 2B, a higher-order resonance frequency (frs2) and a higher-order antiresonant frequency (fast) of series-arm resonator s1, higher-order resonance frequencies (fr2on and fr2off) and a higher-order antiresonant frequency (fap2) of parallel-arm resonant circuit 21 are generated, which are higher than the fundamental mode resonant frequencies and the fundamental mode antiresonant frequencies.

Due to the resonance characteristics described above, passing characteristics of the filter according to the comparative example are as illustrated in the lower diagram in FIG. 2B according to the switching operation of switch SW1. In the vicinity of the passband, only the attenuation pole lower than the passband shifts to a higher frequency by turning switch SW1 off, and the passband is changed.

Here, in the filter according to the comparative example, the interval between the fundamental mode resonant frequency and the higher-order mode resonance frequency of parallel-arm resonant circuit 21 is substantially the same as the interval between the fundamental mode resonant frequency and the higher-order mode resonance frequency of series-arm resonator s1. Thus, the first fractional bandwidth of parallel-arm resonant circuit 21 is substantially the same as the first fractional bandwidth of series-arm resonator s1. Accordingly, as illustrated in the lower diagram in FIG. 2B, characteristics similar to filter characteristics of the passband that result from fundamental mode resonance characteristics occur in the attenuation band higher than the passband, so that attenuation characteristics deteriorate. In particular, by turning switch SW1 off, the impedance of parallel-arm resonant circuit 21 in which capacitive element C1 is added increases, and thus the attenuation near a higher-order mode resonance occurring frequency decreases (insertion loss decreases).

As described above, a filter that includes an acoustic wave resonator has a problem that attenuation characteristics at frequencies higher than the passband further deteriorate due to the occurrence of higher-order mode resonance.

To address the above problem, filter 10Z according to the present embodiment has a feature that the protective film of parallel-arm resonator p1 included in parallel-arm resonant circuit 21 is thinner than the protective film of series-arm resonator s1.

Figure 2C:
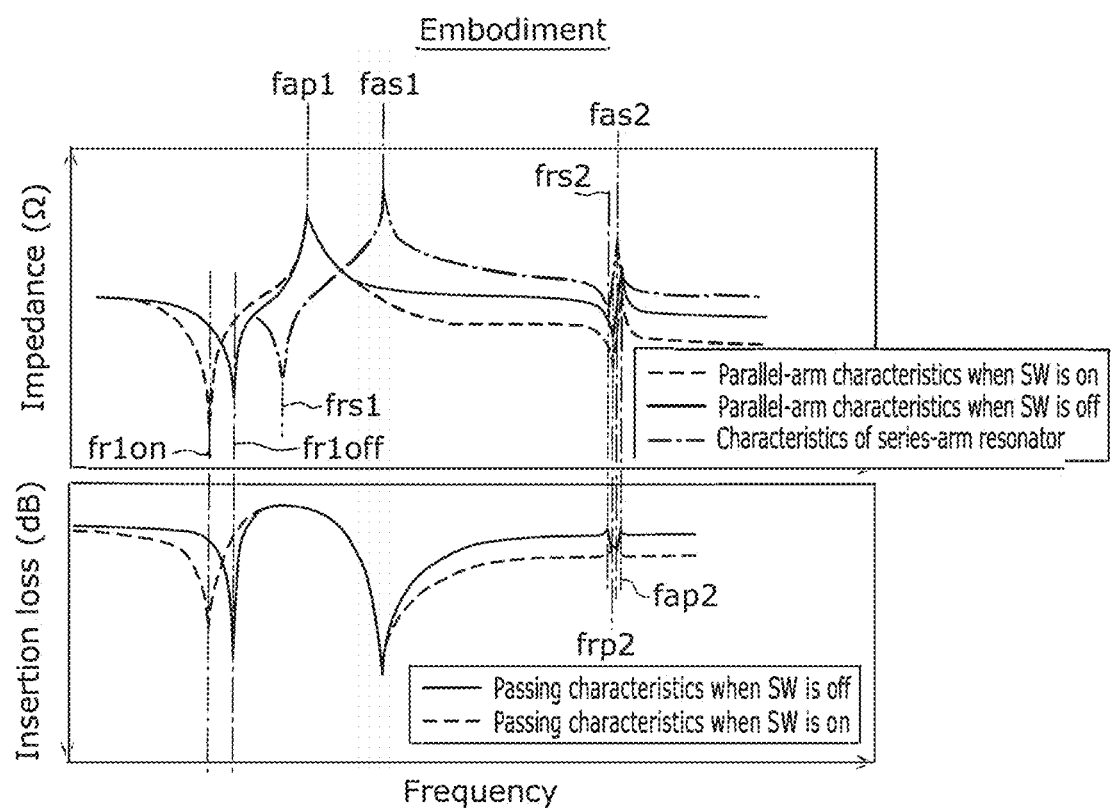
FIG. 2C is a graph illustrating attenuation characteristics of the filter according to the embodiment.

FIG. 2C is a graph illustrating attenuation characteristics of filter 10Z according to the embodiment. As illustrated in the upper diagram in FIG. 2C, parallel-arm resonator p1 has fundamental mode resonant frequencies lower than the passband of filter 10Z, and has a fundamental mode anti-resonant frequency within the passband. The resonant frequencies of parallel-arm resonator p1 are lower than the resonant frequency of series-arm resonator s1, and the antiresonant frequency of parallel-arm resonator p1 is lower than the antiresonant frequency of series-arm resonator s1. Parallel-arm resonant circuit 21 has two resonant frequencies fr1on and fr1off, and one antiresonant frequency fap1 (fr1on<fr1off is satisfied at this time). Also, in filter 10Z according to the embodiment, by switching switch SW1 from on to off, the antiresonant frequency of parallel-arm resonant circuit 21 is not shifted, and only the resonant frequency shifts to a higher frequency (from fr1on to fr1off).

Due to the resonance characteristics described above, passing characteristics of filter 10Z according to the embodiment become characteristics as illustrated in the lower diagram in FIG. 2C, according to the switching operation of switch SW1. In the vicinity of the passband, only the attenuation pole at a frequency lower than the passband shifts to a higher frequency by turning switch SW1 off, thus changing the passband.

Furthermore, higher-order mode resonance occurs at frequencies higher than the passband in filter 10Z. As illustrated in FIG. 2C, the higher-order mode resonant frequency (frs2) and the higher-order mode antiresonant frequency (fast) of series-arm resonator s1, and the higher-order mode resonant frequency (frp2 (including fr2on and fr2off)) and the higher-order mode antiresonant frequency of parallel-arm resonant circuit 21 (fap2) occur, which are higher than the fundamental mode resonant frequencies and the fundamental mode antiresonant frequencies.

Here, in filter 10Z according to the embodiment, the intervals between the fundamental mode resonant frequencies and the higher-order mode resonance frequencies of parallel-arm resonant circuit 21 are each greater than the interval between the fundamental mode resonant frequency and the higher-order mode resonance frequency of series-arm resonator s1. Accordingly, the higher-order mode anti-resonant frequency of series-arm resonator s1 can be brought close to the higher-order mode resonance frequencies of parallel-arm resonant circuit 21, and thus attenuation characteristics in a higher-order mode resonance occurring frequency band (an attenuation band higher than the passband) can be improved, as well as provide a way to control filter selectivity.

[1.3 Electrode Configuration of Filter 10]

Figure 3:
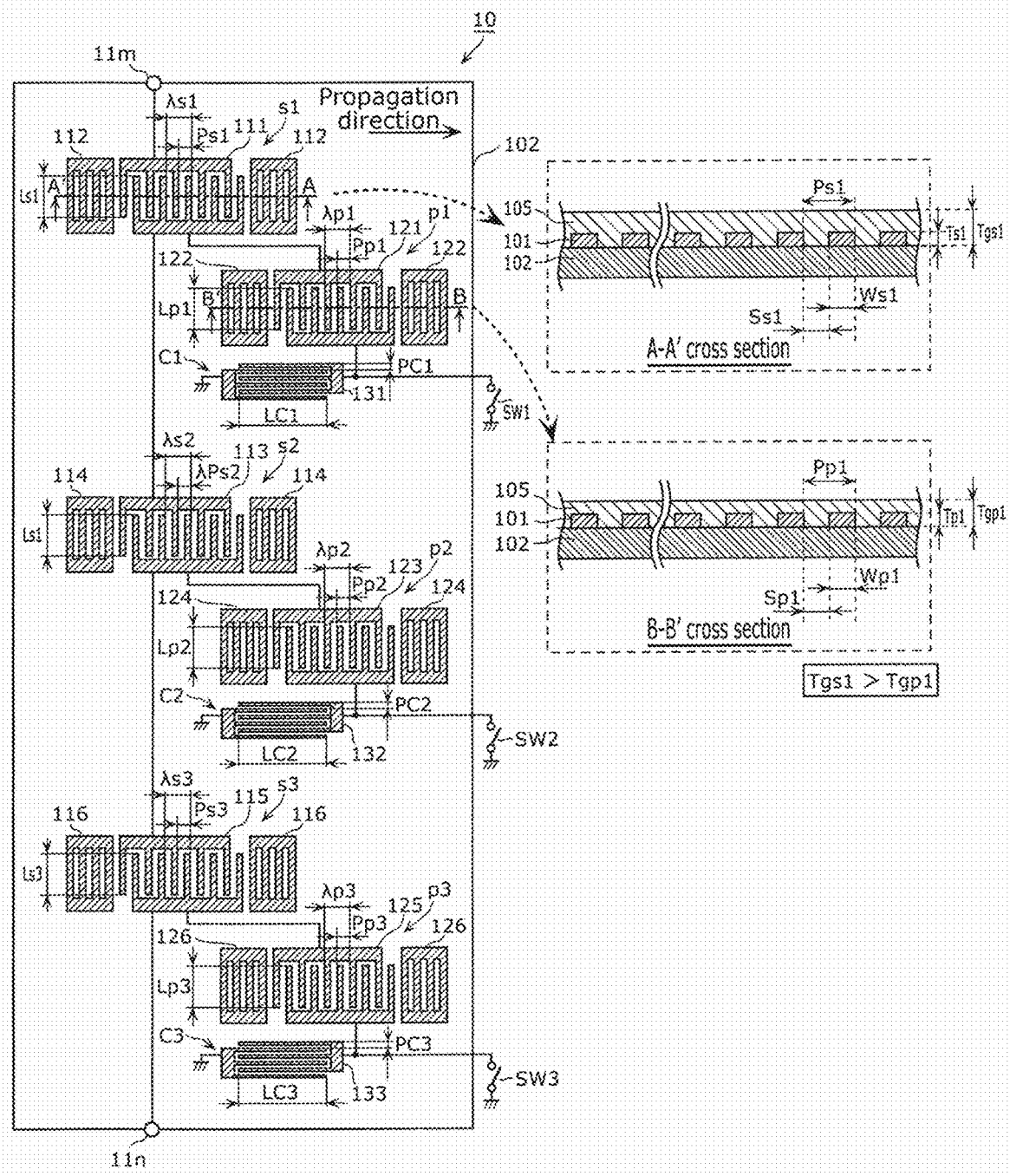
FIG. 3 is a plan view and a cross-sectional view illustrating an electrode configuration of the filter according to Embodiment 1.

FIG. 3 is a plan view and a cross-sectional view illustrating an electrode configuration of filter 10 according to Embodiment 1. The left diagram in FIG. 3 illustrates a plan view of the electrode configuration of filter 10, the right upper diagram in FIG. 3 illustrates a cross-sectional view of series-arm resonator s1 of filter 10 taken along line A-A', and the right lower diagram in FIG. 3 is a cross-sectional view of parallel-arm resonator p1 of filter 10 taken along line B-B'.

As illustrated in the left diagram in FIG. 3, input/output terminals 11$m$ and 11$n$ are disposed on the perimeter portion of the surface of substrate 102. IDT electrode 111 and reflectors 112 included in series-arm resonator s1, IDT electrode 113 and reflectors 114 included in series-arm resonator s2, and IDT electrode 115 and reflectors 116 included in series-arm resonator s3 are formed on the surface of substrate 102. Furthermore, IDT electrode 121 and reflectors 122 included in parallel-arm resonator p1, IDT electrode 123 and reflectors 124 included in parallel-arm resonator p2, and IDT electrode 125 and reflectors 126 included in parallel-arm resonator p3 are formed on the surface of substrate 102. Furthermore, comb-shaped capacitor electrodes 131, 132, and 133 are formed on the surface of substrate 102. Although details are not illustrated, lines that connect input/output terminals 11$m$ and 11$n$, IDT electrodes 111, 113, 115, 121, 123, and 125, and comb-shaped capacitor electrodes 131, 132, and 133 are formed on the surface of substrate 102.

Substrate 102 is at least partially piezoelectric. For example, substrate 102 may have a piezoelectric thin film on the surface, and may include a stacked structure in which a film having a different acoustic velocity from that of the piezoelectric thin film and a support substrate are stacked, for instance. Substrate 102 may be entirely piezoelectric. In this case, substrate 102 is a piezoelectric substrate constituted by a single piezoelectric layer.

IDT electrode 111 and reflectors 112 are constituted by a plurality of electrode fingers, and are included in series-arm resonator s1, together with substrate 102. IDT electrode 113 and reflectors 114 are constituted by a plurality of electrode fingers, and are included in series-arm resonator s2, together with substrate 102. IDT electrode 115 and reflectors 116 are constituted by a plurality of electrode fingers, and are included in series-arm resonator s3, together with substrate 102. IDT electrode 121 and reflectors 122 are constituted by a plurality of electrode fingers, and are included in parallel-arm resonator p1, together with substrate 102. IDT electrode 123 and reflectors 124 are constituted by a plurality of electrode fingers, and are included in parallel-arm resonator p2, together with substrate 102. IDT electrode 125 and reflectors 126 are constituted by a plurality of electrode fingers, and are included in parallel-arm resonator p3, together with substrate 102. Here, the extension direction in which the electrode fingers of IDT electrodes 111, 113, and 115 extend and the extension direction in which the electrode fingers of IDT electrodes 121, 123, and 125 extend substantially match, and the extension directions are perpendicular to the propagating direction of substrate 102. Accordingly, series-arm resonators s1 to s3 and parallel-arm resonators p1 to p3 excite acoustic waves in the same propagating direction.

Comb-shaped capacitor electrodes 131, 132, and 133 are each constituted by a plurality of electrode fingers, and are formed on substrate 102. Here, the extension direction in which the electrode fingers of comb-shaped capacitor electrodes 131 to 133 extend crosses the extension direction in which the electrode fingers of the IDT electrodes extend. Comb-shaped capacitor electrode 131 is included in capacitive element C1 (a capacitor) that is a comb-shaped capacitor, together with substrate 102. Comb-shaped capacitor electrode 132 is included in capacitive element C2 (a capacitor) that is a comb-shaped capacitor, together with substrate 102. Comb-shaped capacitor electrode 133 is included in capacitive element C3 (a capacitor) that is a comb-shaped capacitor, together with substrate 102.

With the above electrode configuration, the series-arm resonators, the parallel-arm resonators, and the capacitive elements included in filter 10 can be formed on single substrate 102, and thus filter 10 can be miniaturized. The values of capacitance are set according to the frequency tunable width by adjusting an electrode finger pitch, a pair count, and a crossing width of comb-shaped capacitor electrodes 131 to 133, for instance.

Switches SW1, SW2, and SW3 are disposed outside substrate 102, and are connected to comb-shaped capacitor electrodes 131, 132, and 133, respectively. Note that switches SW1 to SW3 may be disposed on substrate 102 to reduce the area therefor.

Here, as illustrated in the right diagrams in FIG. 3, filter 10 includes protective films 105 covering the IDT electrodes of parallel-arm resonators p1, p2, and p3, and protective films 105 covering the IDT electrodes of series-arm resonators s1, s2, and s3. Furthermore, protective films 105 of parallel-arm resonators p1, p2, and p3 are thinner than protective films 105 of series-arm resonators s1, s2, and s3. Specifically, the thickness (Tgp1) of protective films 105 covering IDT electrodes 121, 123, and 125 is smaller than the thickness (Tgs1) of protective films 105 covering IDT electrodes 111, 113, and 115. Accordingly, the intervals between the fundamental mode resonant frequencies and the higher-order mode resonance frequencies of parallel-arm resonators p1, p2, and p3 are each greater than the interval between the fundamental mode resonant frequency and the higher-order mode resonant frequency of each of series-arm resonators s1, s2, and s3. Specifically, the first fractional bandwidths of parallel-arm resonators p1, p2, and p3 are greater than the first fractional bandwidths of series-arm resonators s1, s2, and s3, and the second fractional bandwidths of parallel-arm resonators p1, p2, and p3 are greater than the second fractional bandwidths of series-arm resonators s1, s2, and s3.

Accordingly, higher-order mode antiresonant frequencies of series-arm resonators s1, s2, and s3 can be brought close to higher-order mode resonant frequencies of parallel-arm resonators p1, p2, and p3, and thus attenuation characteristics in a higher-order mode resonance occurring frequency band (an attenuation band higher than the passband) can be improved.

Note that the electrode fingers included in the IDT electrodes, the reflectors, and the comb-shaped capacitor electrodes described above may be formed of a single metal film or may be formed of a stacked structure of a plurality of metal films as will be described below. The protective films described above may be each formed of a single dielectric or insulating layer or may be formed of a stacked structure of a plurality of dielectrics or insulators.

In series-arm resonators s1, s2, and s3 and parallel-arm resonators p1, p2, and p3 described above, the wavelength of acoustic waves excited is determined by a design parameter of an IDT electrode, for instance. In the following, the design parameter of an IDT electrode is to be described, using parallel-arm resonator p1 as an example.

The wavelength of acoustic waves is determined by repeating cycle $\lambda p1$ of electrode fingers connected to one bus bar electrode out of the electrode fingers. Electrode finger pitch Pp1 (a pitch of electrode fingers, that is, an electrode finger cycle) is ½ repeating cycle $\lambda p1$, and defined as Pp1=(Wp1+Sp1), where Wp1 denotes the line width of an electrode finger and Sp1 denotes the space width between adjacent electrode fingers. Further, crossing width Lp1 of IDT electrode 121 is the length of overlapping electrode fingers when an electrode finger connected to one of the bus bar electrodes in the set and an electrode finger connected to the other bus bar electrode in the set are viewed in the direction in which acoustic waves propagate. The electrode duty ratio (the duty ratio) indicates a percentage made up by the line width of each of electrode fingers, and is defined by a proportion of the line width of each of the electrode fingers to a value obtained by adding the line width to the space width, that is, Wp1/(Wp1+Sp1). Thus, the electrode duty ratio is defined by the proportion of the width of each of the electrode fingers to an electrode finger pitch (a pitch of electrode fingers), that is, Wp1/Pp1. A pair count is the number of paired electrode fingers, and is substantially half the total number of electrode fingers. For example, Mp1=2Np1+1 is satisfied, where Np1 denotes the pair count, and Mp1 denotes a total number of electrode fingers. The thickness of electrode fingers indicates thickness Tp1 of electrode film 101 that forms the electrode fingers.

Next, the structure of comb-shaped capacitor electrodes 131 to 133 is to be described using comb-shaped capacitor electrode 131 as an example.

Comb-shaped capacitor electrode 131 includes a plurality of electrode fingers. As illustrated in FIG. 3, comb-shaped capacitor electrode 131 is formed of electrode film 101 similarly to IDT electrode 121. Specifically, comb-shaped capacitor electrode 131 included in capacitive element C1 is formed on single substrate 102 on which IDT electrode 121 included in parallel-arm resonator p1 is formed. Note that comb-shaped capacitor electrode 131 and IDT electrode 121 may be formed on different substrates.

Comb-shaped capacitor electrode 131 includes a plurality of electrode fingers, and one set of bus bar electrodes facing each other with the electrode fingers therebetween, and has a configuration in which the electrode fingers are alternately connected to one bus bar electrode and the other bus bar electrode in the set. Here, the electrode fingers are formed in the direction in which acoustic waves propagate, and are cyclically formed in the direction orthogonal to the propagation direction.

In capacitive element C1 having such a configuration, characteristics such as capacitance and a Q factor are determined by design parameters of comb-shaped capacitor electrode 131, for instance. The following is to describe the design parameters of comb-shaped capacitor electrode 131.

Electrode finger pitch PC1 (a pitch of electrode fingers, that is, an electrode finger cycle) is defined as PC1=(WC1+SC1) when WC1 denotes the line width of an electrode finger, and SC1 denotes the space width between adjacent electrode fingers. Further, crossing width LC1 of comb-shaped capacitor electrode 131 is the length of overlapping electrode fingers when an electrode finger connected to one of the bus bar electrodes in the set and an electrode finger connected to the other bus bar electrode in the set are viewed in the direction in which acoustic waves propagate. The electrode duty ratio (the duty ratio) indicates a percentage made up by the line width of each of electrode fingers, and is defined by a proportion of the line width of each of the electrode fingers to a value obtained by adding the line width to the space width, that is, WC1/(WC1+SC1). Thus, the electrode duty ratio is defined by the proportion of the width of each of the electrode fingers to an electrode finger pitch, that is, WC1/PC1. A pair count is the number of paired electrode fingers, and is substantially half the total number of electrode fingers. For example, MC1=2NC1+1 is satisfied, where NC1 denotes the pair count, and MC1 denotes a total number of electrode fingers. The thickness of electrode fingers indicates thickness TC1 of electrode film 101 that forms the electrode fingers.

Next, design parameters of comb-shaped capacitor electrodes 131 to 133 included in capacitive elements C1 to C3, and IDT electrodes 121, 123, and 125 in parallel-arm resonators p1 to p3 connected to capacitive elements C1 to C3 are to be described by making comparisons. Note that the following describes a relation between IDT electrode 121 of parallel-arm resonator p1 and capacitive element C1 out of capacitive elements C1 to C3. This relation also applies to a relation between capacitive element C2 and IDT electrode 123 of parallel-arm resonator p2, and a relation between capacitive element C3 and IDT electrode 125 of parallel-arm resonator p3.

The electrode finger pitch of capacitive element C1 is narrower than the electrode finger pitch of parallel-arm resonator p1 (the second acoustic wave resonator). Thus, PC1<Pp1 is satisfied. Here, the pitch of electrode fingers in capacitive element C1 is preferably 80% or less of a pitch of electrode fingers in parallel-arm resonator p1 (the second acoustic wave resonator) (specifically, $PC1 \leq 0.8 \times Pp1 = 0.4 \times \lambda p1$).

The electrode fingers in capacitive element C1 are thinner than the electrode fingers in parallel-arm resonator p1. Thus, TC1<Tp1 is satisfied. Here, for a manufacturing reason, thickness TC1 of the electrode fingers is preferably 40% or less of electrode finger pitch PC1 (specifically, $TC1 \leq 0.40 \times PC1$) in capacitive element C1. For a similar reason, thickness Tp1 of the electrode fingers is preferably 40% or less of electrode finger pitch Pp1 (specifically, $Tp1 \leq 0.40 \times Pp1$) in parallel-arm resonator p1. Further, the lower limit of thickness TC1 of the electrode fingers is not limited in particular, but is 15% or more of electrode finger pitch PC1 (specifically, $0.15 \times PC1 \leq TC1$), for example. Similarly, the lower limit of thickness Tp1 of the electrode fingers is not limited in particular, but is 15% or more of electrode finger pitch Pp1 (specifically, $0.15 \times Pp1 \leq Tp1$), for example.

The electrode duty ratio of capacitive element C1 is preferably greater than the electrode duty ratio of parallel-arm resonator p1. Specifically, capacitive element C1 and parallel-arm resonator p1 preferably satisfy WC1/PC1>Wp1/Pp1. With such a configuration, capacitance of capacitive element C1 per unit area can be increased, and thus the size of capacitive element C1 and space therefor are reduced.

Note that the electrode finger pitch, the thickness, and the electrode duty ratio, for instance of each of the elements (such as series-arm resonators s1 to s3, parallel-arm resonators p1 to p3, and capacitive element C1 to C3) are not necessarily even, and may be uneven due to variations caused in the manufacturing process, for instance, or due to adjustment of characteristics, for instance. Accordingly, portions of comb-shaped capacitor electrode 131 and IDT electrode 121 included in capacitive element C1 and parallel-arm resonator p1 may not satisfy the above relations of, for instance, the electrode finger pitch, the thickness, and the duty ratio. Specifically, the relations of the electrode finger pitch, the thickness, and the electrode duty ratio between capacitive element C1 and parallel-arm resonator p1 may be substantially satisfied, and may be satisfied between an average of capacitive element C1 and an average of parallel-arm resonator p1, for example.

[1.4 Detailed Structure of Electrode Finger]

Here, the case where a plurality of electrode fingers included in the IDT electrodes, the reflectors, and the comb-shaped capacitor electrodes are formed of a stacked structure of a plurality of metal films is to be described. Note that in the following description, the IDT electrodes and the comb-shaped capacitor electrodes are formed of common electrode film 101 except that the electrodes have different thicknesses, but may be formed of electrode films having different structures and different compositions, for instance.

Figure 4A:
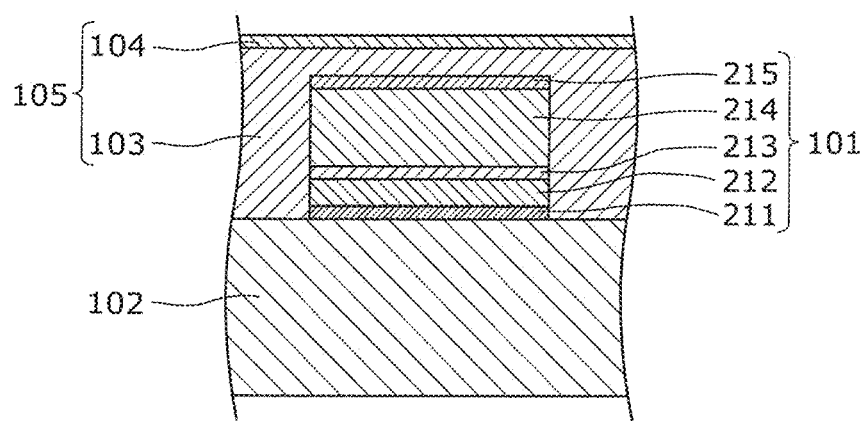
FIG. 4A is a cross-sectional view illustrating a structure that includes an electrode film and a surrounding structure in Embodiment 1.
Figure 4B:
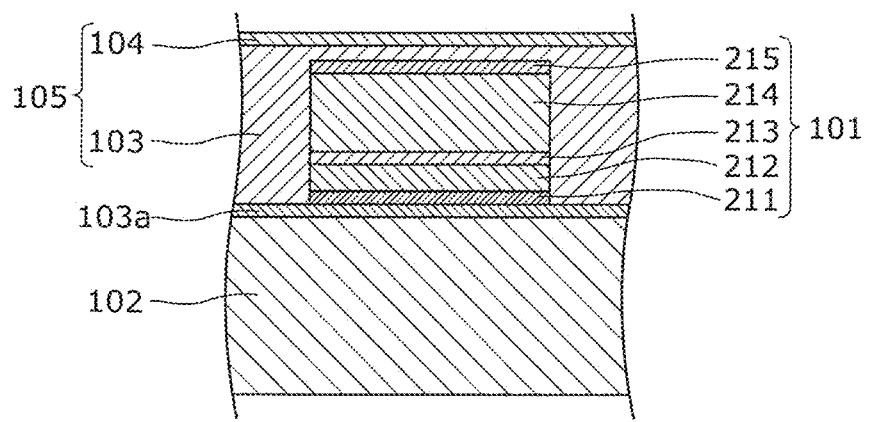
FIG. 4B is a cross-sectional view illustrating another example of a structure that includes the electrode film and a surrounding structure in Embodiment 1.

FIG. 4A is a cross-sectional view illustrating a structure that includes electrode film 101 that forms the electrode fingers of the IDT electrodes and the electrode fingers of the comb-shaped capacitor electrodes and a surrounding structure in Embodiment 1. FIG. 4B is a cross-sectional view illustrating another example of a structure that includes electrode film 101 that forms the electrode fingers of the IDT electrodes and the electrode fingers of the comb-shaped capacitor electrodes and a surrounding structure in Embodiment 1.

As illustrated in FIG. 4A, electrode film 101 is formed by stacking, above substrate 102 in this order, metal film 211 made of NiCr, metal film 212 made of Pt, metal film 213 made of Ti, metal film 214 made of AlCu, and metal film 215 made of Ti. At this time, substrate 102 is made of a $LiNbO_3$ piezoelectric single crystal, for example.

Electrode film 101 is covered with a protective film intended to protect electrode film 101 from the outside environment, and furthermore, to adjust frequency temperature characteristics and increase moisture resistance. The protective film is formed by stacking, above substrate 102 in this order, protective film 103 made of $SiO_2$, and protective film 104 made of SiN, in the present embodiment.

Note that adjustment film 103a for adjusting an electromechanical coupling factor may be disposed between electrode film 101 and substrates 102, as illustrated in FIG. 4B. Adjustment film 103a for adjusting an electromechanical coupling factor is made of $SiO_2$.

Note that protective film 103 and protective film 104 are collectively denoted as protective film 105 (already illustrated in FIG. 3) in FIGS. 4A and 4B.

Metal film 212 made of Pt has the highest density, out of metal films 211 to 215 included in the stacked structure. Metal films 211, 213, 214, and 215 are metal films other than metal film 212 having the highest density.

Filter 10 according to Embodiment 1 above has a feature that protective films 105 of parallel-arm resonators p1, p2, and p3 are thinner than protective films 105 of series-arm resonators s1, s2, and s3, under a condition that electrode fingers included in the IDT electrodes and the comb-shaped capacitor electrodes are formed of a single metal film.

Note that the configuration of electrode film 101 illustrated in FIGS. 4A and 4B is an example, and the present disclosure is not limited thereto. As described above, electrode film 101 may be a single layer of a metal film, rather than a stacked structure of metal films. The materials used for the metal films and the protective film are not limited to the above-mentioned materials. Electrode film 101 may include metal such as, for example, Ti, Al, Cu, Pt, Au, Ag, Pd or an alloy of such metals, or may have a structure in which layers made of such metals or an alloy of such metals are stacked. Substrate 102 may be made of a $LiTaO_3$ piezoelectric single crystal, a $KNbO_3$ piezoelectric single crystal, rock crystal, or piezoelectric ceramics, for example. The configurations of protective films 103, 104, and 103b and adjustment film 103a for adjusting an electromechanical coupling factor are not limited to the above configurations, and may include a dielectric or an insulator that includes, for instance, $SiO_2$, SiN, AlN, polyimide, or a structure of stacked layers made of such materials, for example. Further, one of protective films 103 and 104 may not be formed.

[1.5 Resonance Characteristics of Filter]

The following is to describe resonance characteristics when the thickness of a protective film included in an acoustic wave resonator is changed.

Figure 5A:
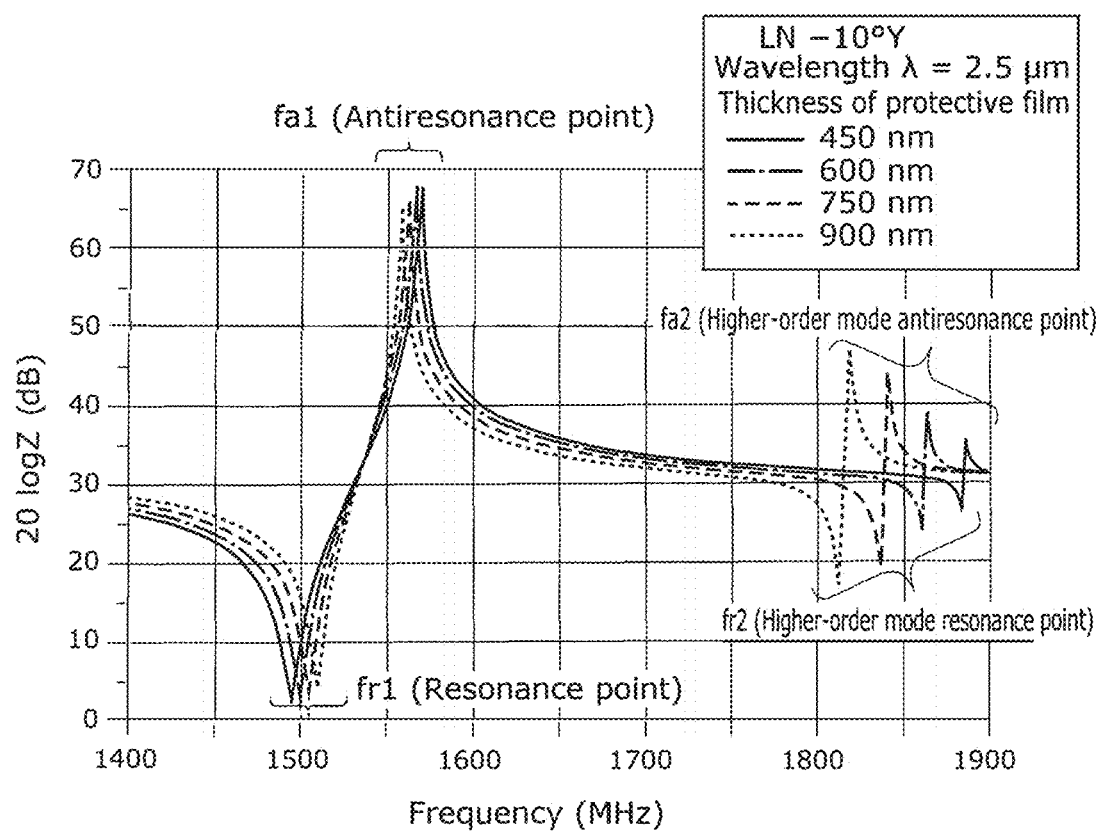
FIG. 5A is a graph illustrating resonance characteristics of a surface acoustic wave resonator when the thickness of a protective film is changed.
Figure 5B:
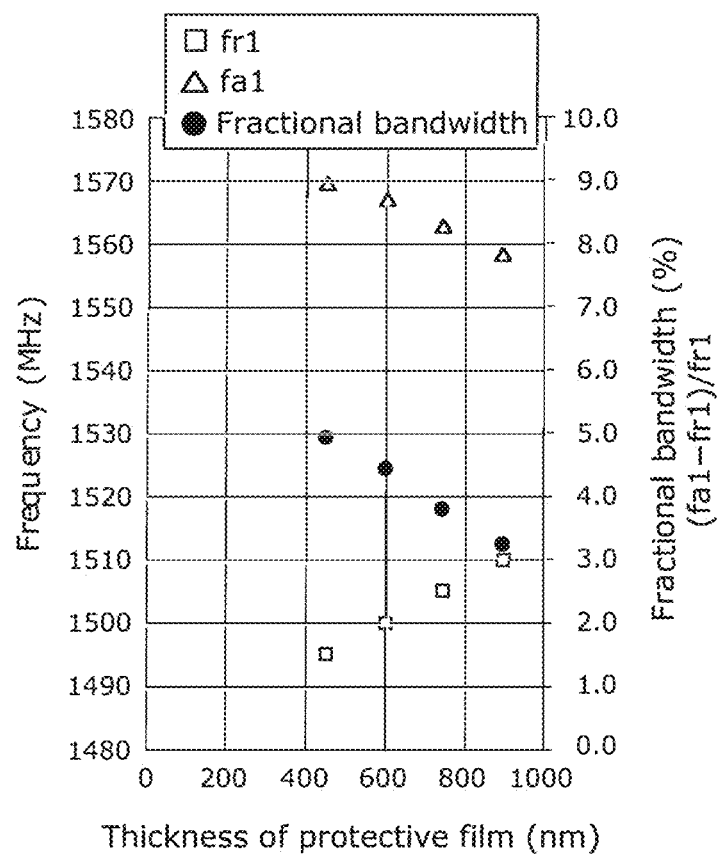
FIG. 5B is a graph illustrating a fundamental mode resonant frequency, a fundamental mode antiresonant frequency, and a fundamental mode fractional bandwidth when the thickness of the protective film is changed.
Figure 5C:
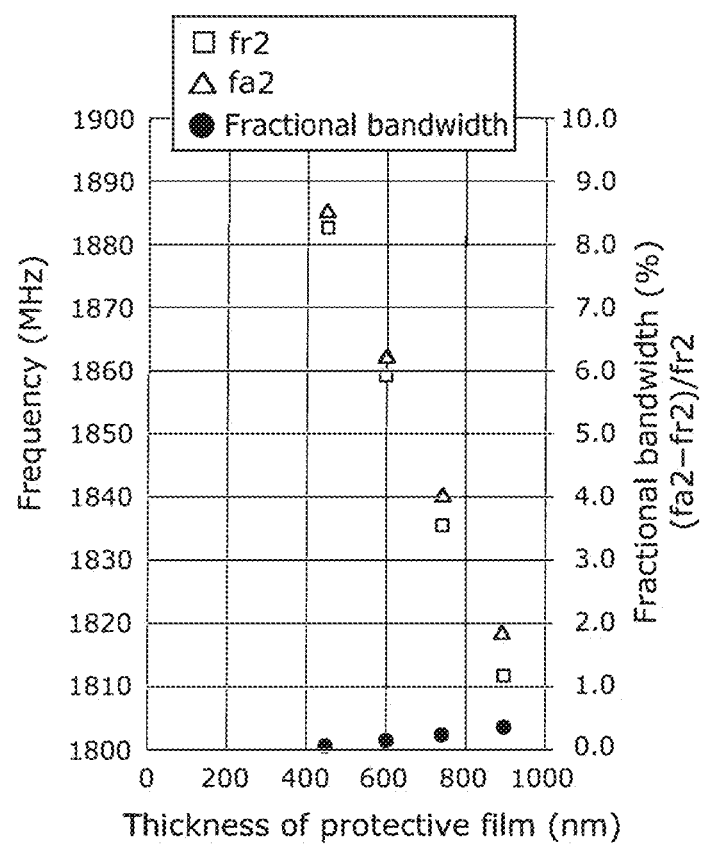
FIG. 5C is a graph illustrating a higher-order mode resonance frequency, a higher-order mode antiresonant frequency, and a higher-order mode fractional bandwidth when the thickness of the protective film is changed.
Figure 5D:
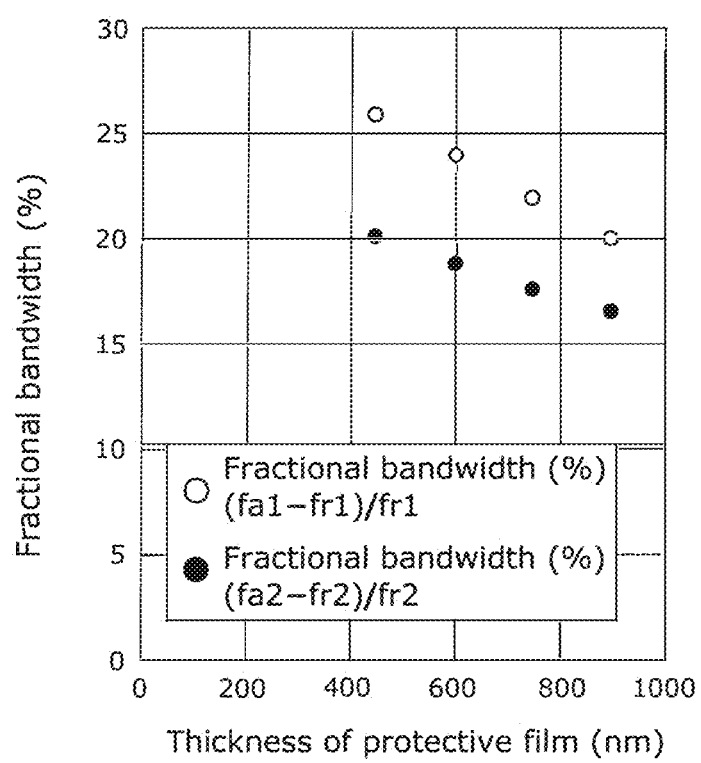
FIG. 5D is a graph illustrating a first fractional bandwidth and a second fractional bandwidth when the thickness of the protective film is changed.

FIG. 5A is a graph illustrating resonance characteristics of a surface acoustic wave resonator when the thickness of the protective film is changed. FIG. 5B is a graph illustrating a fundamental mode resonant frequency, a fundamental mode antiresonant frequency, and a fundamental mode fractional bandwidth when the thickness of the protective film is changed. FIG. 5C is a graph illustrating a higher-order mode resonance frequency, a higher-order mode antiresonant frequency, and a higher-order mode fractional bandwidth when the thickness of the protective film is changed. FIG. 5D is a graph illustrating the first fractional bandwidth and the second fractional bandwidth when the thickness of the protective film is changed.

FIG. 5A illustrates resonance characteristics of a surface acoustic wave resonator that includes an IDT electrode that includes substrate 102 for which an X-propagation $LiNbO_3$ piezoelectric single crystal having −10° cut angle relative to the Y axis is used, electrode film 101 illustrated in FIG. 4A, and protective film 105, when the thickness of protective film 105 is changed.

As illustrated in FIG. 5A, the thicker protective film 105 is, the narrower the fundamental mode fractional bandwidth is. It can be seen that the thicker protective film 105 is, the lower the higher-order mode resonance frequency and the higher-order mode antiresonant frequency are, and furthermore the greater a higher-order mode response (a difference between impedance at higher-order mode resonant frequency fr2 and impedance at higher-order mode antiresonant frequency fa2) is.

As illustrated in FIG. 5B, the thicker protective film 105 is, the higher the fundamental mode resonant frequency (fr1) is, the lower the fundamental mode antiresonant frequency (fa1) is, and the narrower the fundamental mode fractional bandwidth is.

As illustrated in FIG. 5C, the thicker protective film 105 is, the lower the higher-order mode resonance frequency (fr2) and the higher-order mode antiresonant frequency (fa2) are, and furthermore, the greater the higher-order mode fractional bandwidth is.

As illustrated in FIG. 5D, the thicker protective film 105 is, the narrower the first fractional bandwidth and the second fractional bandwidth are.

The results in FIGS. 5A to 5D show that the fundamental mode fractional bandwidth, the fundamental mode first fractional bandwidth, and the fundamental mode second fractional bandwidth change when the thickness of protective film 105 is changed.

Accordingly, in filter 10 according to the present embodiment, the fundamental mode antiresonant frequencies of parallel-arm resonators p1 to p3 are within the passband of filter 10. Furthermore, it is necessary to increase the fundamental mode fractional bandwidths of parallel-arm resonators p1 to p3 in order to ensure a great frequency tunable width of filter 10, and thus protective films 105 formed in IDT electrodes 121, 123, and 125 of parallel-arm resonators p1 to p3 are desirably thin. The thinner protective films 105 are, the narrower the higher-order mode fractional bandwidth is and the smaller a higher-order mode response is, and furthermore the wider the first fractional bandwidth and the second fractional bandwidth are.

On the other hand, the fundamental mode resonant frequencies of series-arm resonators s1 to s3 are within the passband of filter 10. Note that series-arm resonators s1 to s3 do not have a frequency tunable function, and thus it is necessary to increase the steepness of slopes in the vicinity of the passband by decreasing the fundamental mode fractional bandwidth. Accordingly, protective films 105 are desirably thick.

By making protective films 105 of parallel-arm resonators p1 to p3 thinner than protective films 105 of series-arm resonators s1 to s3, the frequency tunable width is increased, and furthermore the steepness of slopes in the vicinity of the passband can be increased. Furthermore, the first fractional bandwidths of parallel-arm resonators p1 to p3 can be made greater than the first fractional bandwidths of series-arm resonators s1 to s3, and the second fractional bandwidths of parallel-arm resonators p1 to p3 can be made greater than the second fractional bandwidths of series-arm resonators s1 to s3. Accordingly, differences between higher-order antiresonant frequencies of series-arm resonators s1 to s3 and the higher-order resonance frequencies of the parallel-arm resonators can be decreased, and thus the attenuation increases, and attenuation characteristics at frequencies higher than the passband of filter 10 improve.

[1.6 Passing Characteristics of Filter]

Here, passing characteristics of filter 10 according to Embodiment 1 (the example) are to be described by making comparison with passing characteristics of a filter according to a comparative example.

In filter 10 according to this example, an X-propagation $LiNbO_3$ piezoelectric single crystal having −10° cut angle relative to the Y axis is used as substrate 102.

Filter 10 according to this example switches between the receiving band of Band 11 (1475.9 MHz to 1495.9 MHz) and the receiving band of Band 21 (1495.9 MHz to 1510.9 MHz) in accordance with the LTE communication standard.

In filter 10 according to this example, protective films 105 of parallel-arm resonators p1 to p3 are thinner than protective films 105 of series-arm resonators s1 to s3. Specifically, $SiO_2$ is used for the protective films of parallel-arm resonators p1 to p3 and series-arm resonators s1 to s3, the thickness of the protective films of parallel-arm resonators p1 to p3 is 650 nm, and the thickness of the protective films of series-arm resonators s1 to s3 is 750 nm.

On the other hand, the filter according to the comparative example is different from filter 10 according to the example in that the thickness of the protective films of parallel-arm resonators p1 to p3 ($SiO_2$ thickness: 750 nm) is the same as the thickness of the protective films of series-arm resonators s1 to s3 ($SiO_2$ thickness: 750 nm). Note that as described above, the thickness of the protective films of parallel-arm resonators p1 to p3 in the filter according to the comparative example is different from the thickness of the protective films of parallel-arm resonators p1 to p3 in filter 10 according to the example. Due to this difference in thickness only, resonant frequencies and antiresonant frequencies of parallel-arm resonators p1 to p3 are different between filter 10 according to the example and the filter according to the comparative example. However, by adjusting wavelengths λ of parallel-arm resonators p1 to p3, a relation between a frequency at a fundamental mode resonance point and a frequency at a fundamental mode antiresonance point is under the same condition for filter 10 according to the example and the filter according to the comparative example.

Figure 6A:
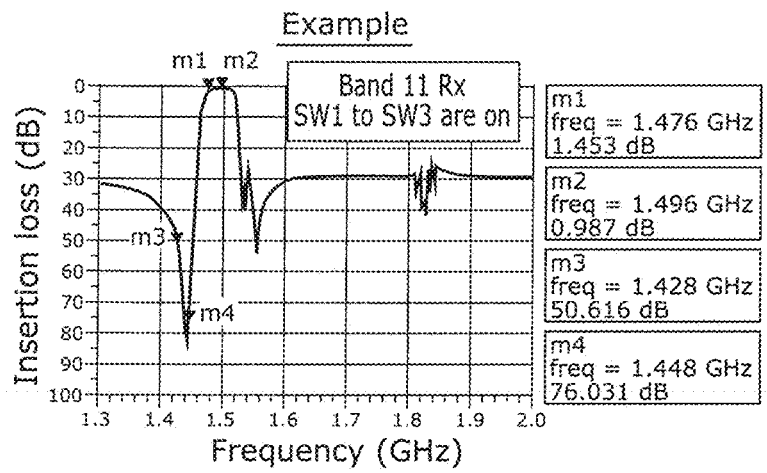
Figure 6B:
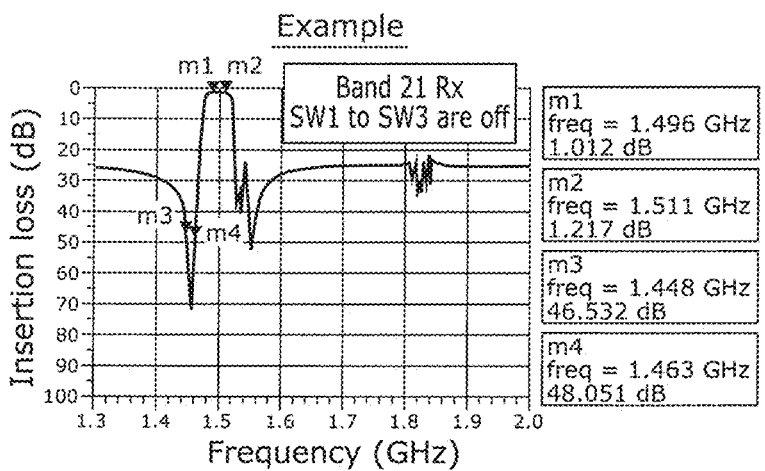
FIG. 6B is a graph illustrating passing characteristics of the filter according to Embodiment 1 (the example) when the switches are off.
Figure 6C:
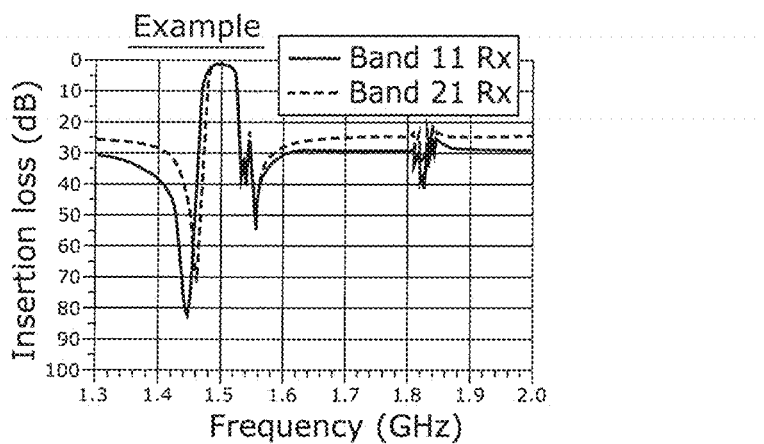
FIG. 6C is a graph illustrating a comparison of passing characteristics of the filter according to Embodiment 1 (the example) when the switches are on and off.

FIG. 6A is a graph illustrating passing characteristics (Band 11-Rx) of filter 10 according to the example when the switches are on. FIG. 6B is a graph illustrating passing characteristics (Band 21-Rx) of filter 10 according to the example when the switches are off. FIG. 6C is a graph illustrating a comparison of passing characteristics of filter 10 according to the example when the switches are on (solid line) and off (dashed line).

Figure 7A:
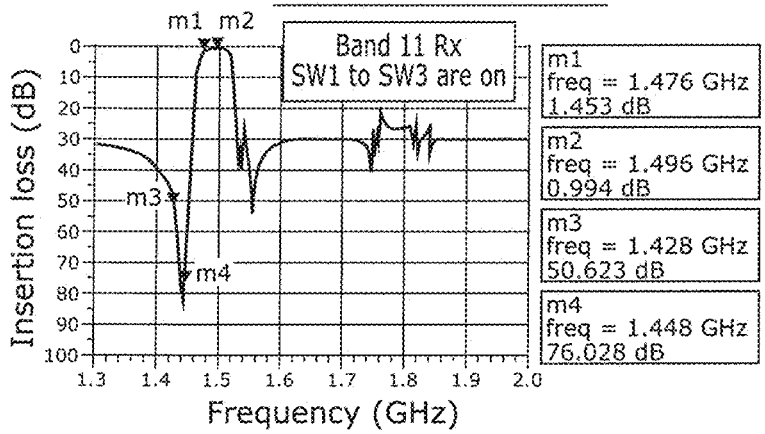
Figure 7B:
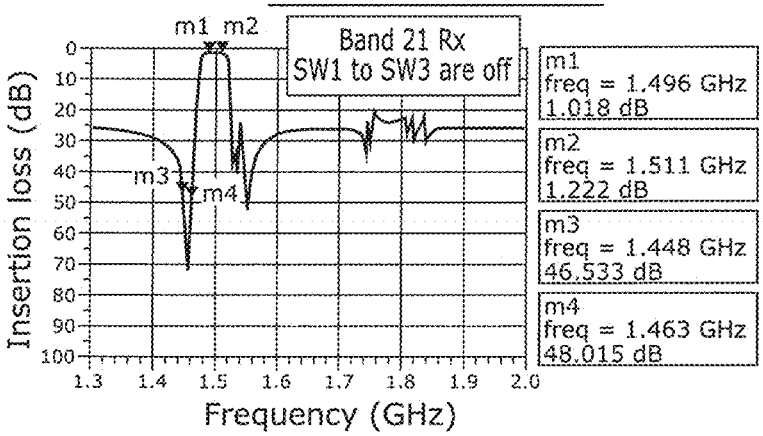
FIG. 7B is a graph illustrating passing characteristics of the filter according to the comparative example when the switches are off.
Figure 7C:
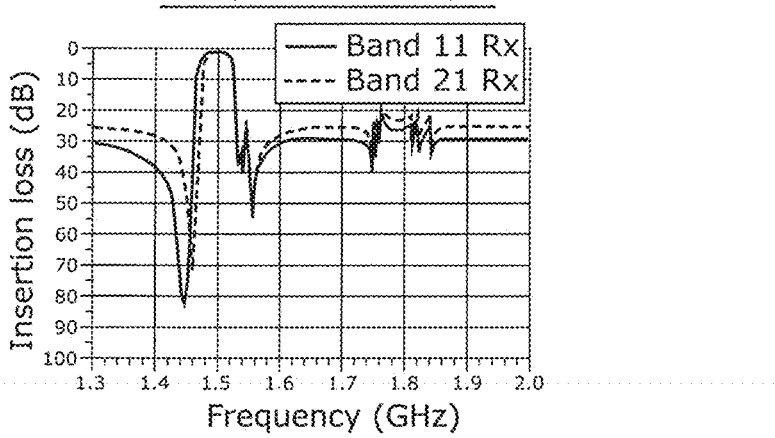
FIG. 7C is a graph illustrating a comparison of passing characteristics of the filter according to the comparative example when the switches are on (solid line) and off (dashed line).

On the other hand, FIG. 7A is a graph illustrating passing characteristics (Band 11-Rx) of the filter according to the comparative example when the switches are on. FIG. 7B is a graph illustrating passing characteristics (Band 21-Rx) of the filter according to the comparative example when the switches are off. FIG. 7C is a graph illustrating a comparison of passing characteristics of the filter according to the comparative example when the switches are on and off.

Figure 8A:
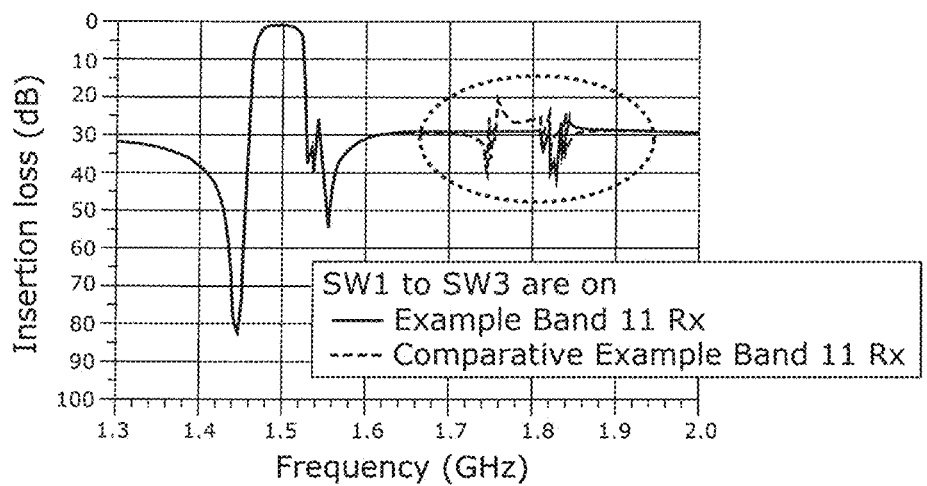
Figure 8B:
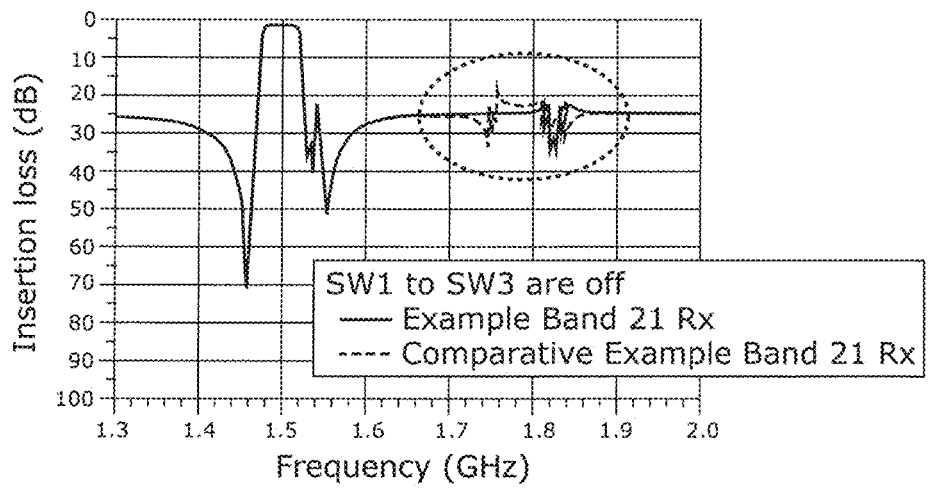
FIG. 8B is a graph illustrating a comparison of passing characteristics of the filters according to the example and the comparative example when the switches are off.

Furthermore, FIG. 8A is a graph illustrating a comparison of passing characteristics (Band 11-Rx) of the filters according to the example and the comparative example when the switches are on. FIG. 8B is a graph illustrating a comparison of passing characteristics (Band 21-Rx) of the filters according to the example and the comparative example when the switches are off.

A comparison between FIGS. 6A and 7A shows that insertion loss in the passband (markers m1 and m2 in the drawings) is substantially the same in the example and the comparative example. A comparison between FIGS. 6B and 7B shows that insertion loss in the passband (markers m1 and m2 in the drawings) is substantially the same and also the attenuation in the lower-frequency attenuation band in the vicinity of the passband (markers m3 and m4 in the drawings) is substantially the same in the example and the comparative example.

In contrast, the attenuation is greater in the example than the attenuation in the comparative example, at and around the higher-order mode resonant frequencies higher than the passbands (in the dashed circles in the drawings), as illustrated in FIGS. 8A and 8B. Note that higher-order mode resonance mainly includes a higher-order mode shear horizontal (SH) wave. Specifically, filter 10 according to the example as compared with the filter according to the comparative example improves attenuation characteristics at frequencies higher than the passband while maintaining passband insertion loss and attenuation in the vicinity thereof. The primary factor thereof is to be described with reference to FIGS. 9A and 9B.

Figure 9A:
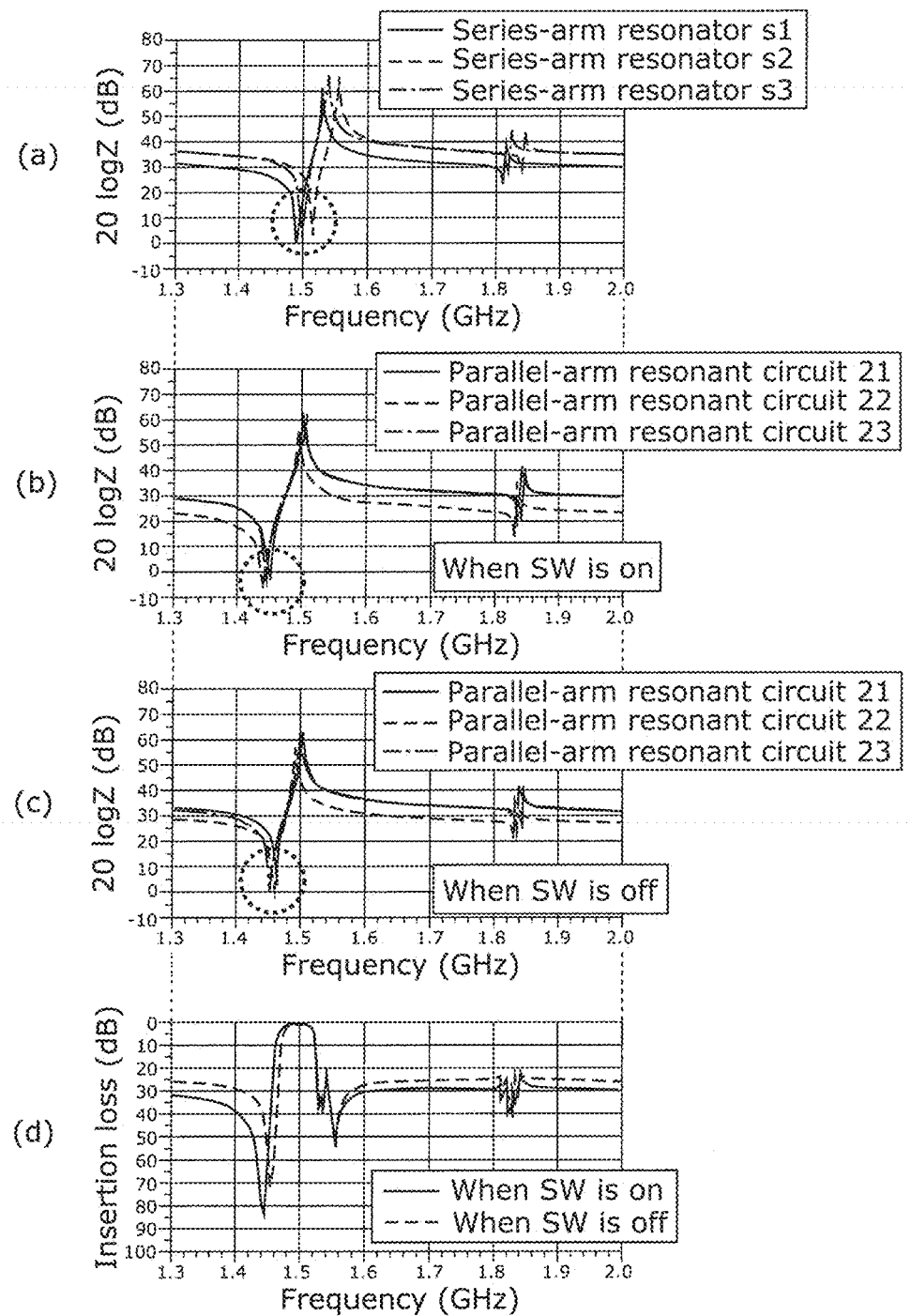
FIG. 9A illustrates graphs showing resonance characteristics and passing characteristics in a wide band of the filter according to the example.
Figure 9B:
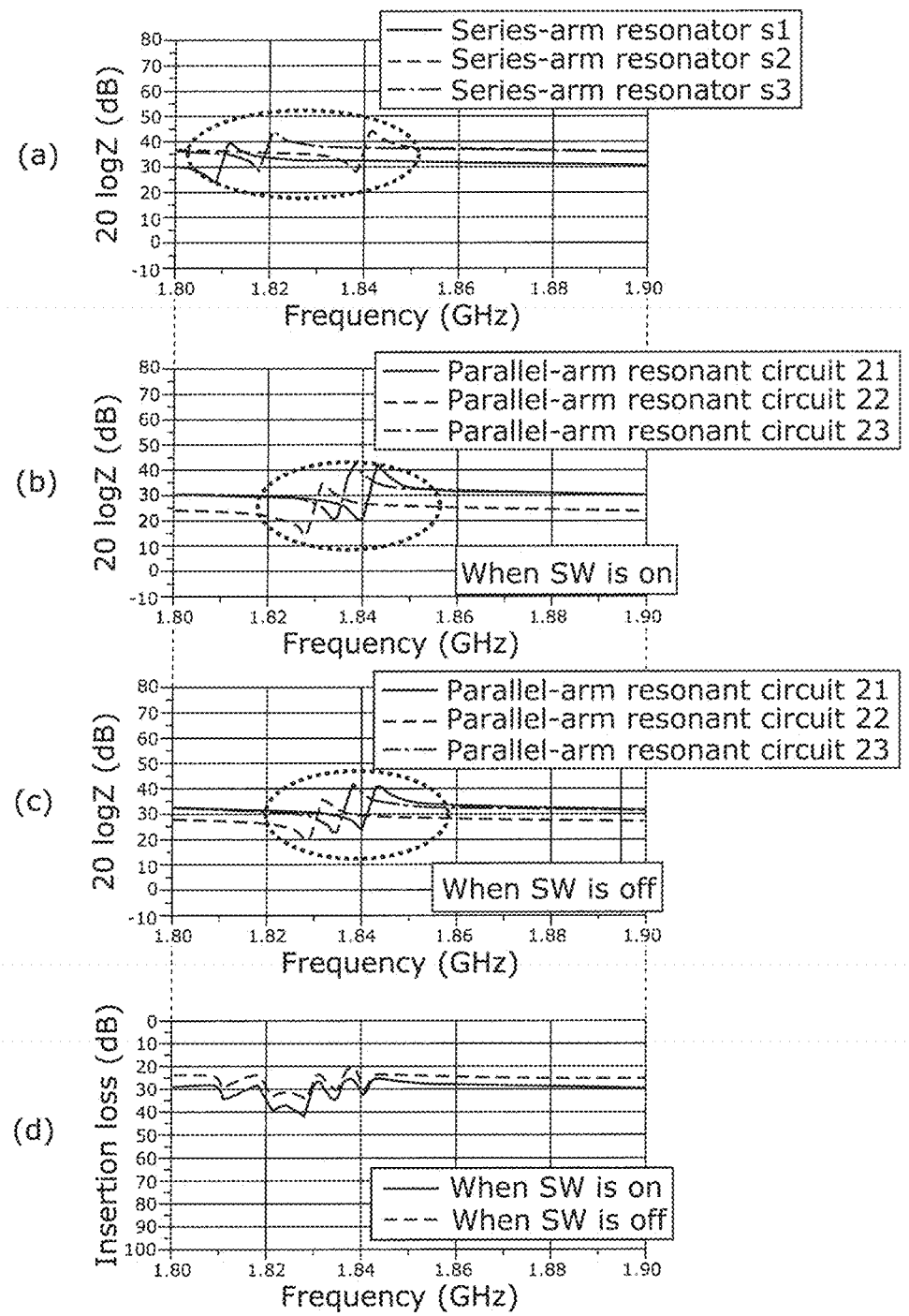
FIG. 9B illustrates graphs showing resonance characteristics and passing characteristics in a higher-frequency attenuation band of the filter according to the example.

FIG. 9A illustrates graphs showing resonance characteristics and passing characteristics in a wide band (1.3 GHz to 2.0 GHz) of filter 10 according to the example. FIG. 9B illustrates graphs showing resonance characteristics and passing characteristics in a higher-frequency attenuation band (1.8 GHz to 1.9 GHz) of filter 10 according to the example.

Part (a) of FIG. 9A illustrates resonance characteristics of series-arm resonators s1 to s3, (b) of FIG. 9A illustrates resonance characteristics of parallel-arm resonators p1 to p3 when the switches are on, (c) of FIG. 9A illustrates resonance characteristics of parallel-arm resonators p1 to p3 when the switches are off, (d) of FIG. 9A illustrates a comparison of passing characteristics when the switches of filter 10 are on and off. In contrast, (a) to (d) of FIG. 9B correspond to enlarged higher-order mode resonance occurring bands in (a) to (d) of FIG. 9A. Comparisons of (a) to (c) of FIG. 9B show that higher-order mode resonance occurring points of parallel-arm resonators p1 to p3 are at frequencies higher than higher-order mode resonance occurring points of series-arm resonators s1 to s3.

Specifically, in filter 10 according to the example, the thickness (SiO$_2$ thickness: 650 nm) of protective films 105 of parallel-arm resonators p1 to p3 is made smaller than the thickness (SiO$_2$ thickness: 750 nm) of protective films 105 of series-arm resonators s1 to s3, and thus the frequency interval between the fundamental mode resonance point and the higher-order mode resonance point of a parallel-arm resonator is greater than the fundamental mode resonance point and the higher-order mode resonance point of a series-arm resonator. Accordingly, the frequency at the higher-order mode resonance occurring point of a parallel-arm resonator and the frequency at the higher-order mode resonance occurring point of a series-arm resonator can be brought close to each other, and thus attenuation characteristics in a higher-order mode resonance occurring frequency band (an attenuation band higher than the passband) can be improved.

Note that filter 10 may not turn on/off all switches SW1 to SW3 together, and may individually turn on/off switches SW1 to SW3. However, if all switches SW1 to SW3 are turned on/off together, the number of control lines for controlling switches SW1 to SW3 can be decreased, and thus the configuration of filter 10 can be simplified.

[1.7 Variation of Tunable Filter Circuit]

The configurations of filters 10 and 10Z according to the present embodiment are applicable to the configurations of other tunable filters. In view of this, configurations and filter characteristics of other tunable filters are to be described in the following, as variations of the filter according to the present embodiment.

Note that the circuit configurations of filters described in Variations 1 to 5 below each show a ladder circuit in which one series-arm resonator and one or two parallel-arm resonators are combined, as an example. Yet, as with the relations of filters 10 and 10Z, a filter that includes a plurality of stages of filter circuits illustrated in Variations 1 to 5 is also included in the filter according to the present disclosure.

[1.7.1 Variation 1 of Filter Circuit]

The above embodiment has described, as impedance circuit 11, a circuit in which switch SW1 and capacitive element C1 are connected in parallel, as an example. However, the configuration of an impedance circuit is not limited to such a configuration.

Figure 10A:
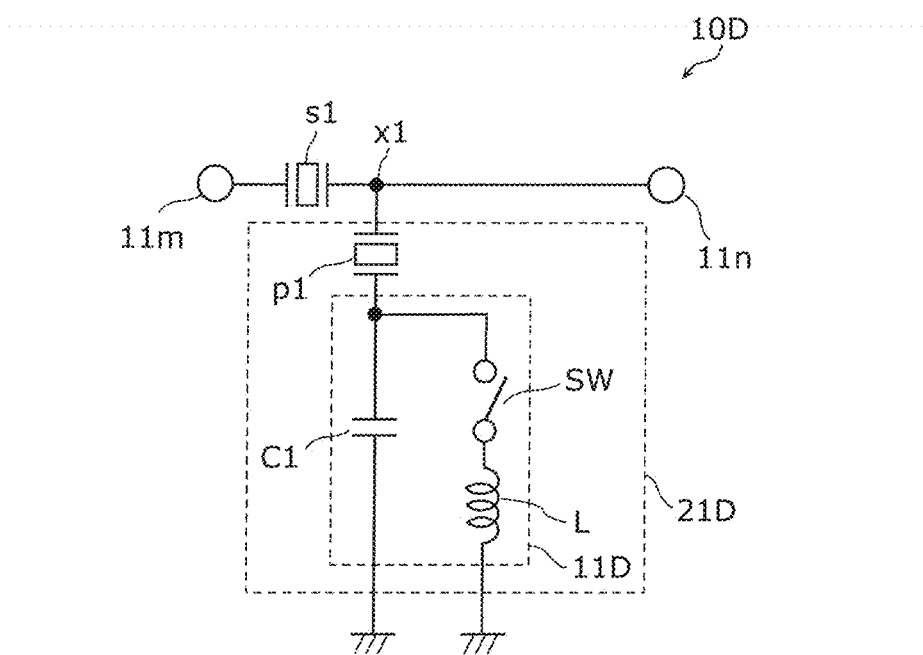
FIG. 10A illustrates a circuit configuration of a filter according to Variation 1 of Embodiment 1.

FIG. 10A illustrates a portion of a circuit configuration of filter 10D according to Variation 1 of Embodiment 1.

Filter 10D illustrated in FIG. 10A further includes inductor L connected in series to switch SW, as compared with filter 10Z illustrated in FIG. 2A. Specifically, in this variation, impedance circuit 11D is configured by connecting, in parallel to capacitive element C1, a circuit in which switch SW and inductor L are connected in series. Parallel-arm resonant circuit 21D is configured by connecting impedance circuit 11D to parallel-arm resonator p1 (the second acoustic wave resonator).

Note that the order in which switch SW and inductor L are connected are not particularly limited, and may be opposite to the connection order in FIG. 10A.

Figure 10B:
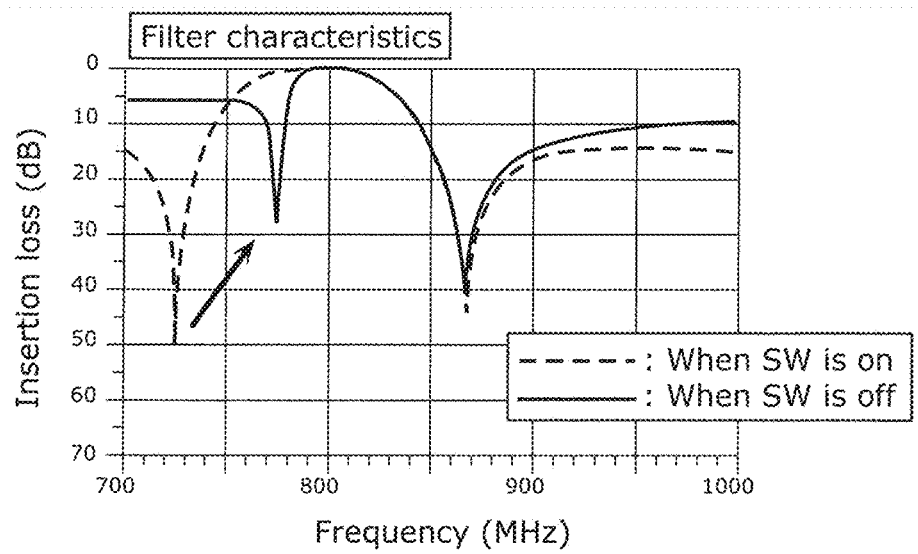
FIG. 10B is a graph illustrating passing characteristics of the filter according to Variation 1 of Embodiment 1.

FIG. 10B is a graph illustrating passing characteristics of filter 10D according to Variation 1 of Embodiment 1. Specifically, FIG. 10B is a graph illustrating a comparison of passing characteristics when switch SW is on and off.

Filter 10D forms a passband by bringing an antiresonant frequency of parallel-arm resonant circuit 21D and a resonant frequency of series-arm resonator s1 close to each other.

At this time, in this variation, inductor L is added to parallel-arm resonator p1 when switch SW is on, and capacitive element C1 is added to parallel-arm resonator p1 when switch SW is off. Accordingly, the resonant frequency of parallel-arm resonant circuit 21D shifts to a frequency lower than the resonant frequency of parallel-arm resonator p1 alone when switch SW is turned on, and to a frequency higher than the resonant frequency of parallel-arm resonator p1 alone when switch SW is turned off. Thus, as illustrated in FIG. 10B, filter 10D according to this variation can increase the frequency tunable width of the passband, as compared with filter 10Z according to Embodiment 1.

With regard to this, the frequency tunable width of the passband of filter 10D depends on the constants of capacitive element C1 and inductor L, and increases with the constant of the inductor, for example. Accordingly, the constant of inductor L may be determined as appropriate, according to the frequency specification that filter 10D is to have. An inductor may be a variable inductor for which micro-electromechanical systems (MEMS) are used. Thus, a frequency tunable width can be adjusted finely.

In filter 10D described above, protective film 105 of parallel-arm resonator p1 is thinner than protective film 105 of series-arm resonator s1. Accordingly, the frequency interval between the fundamental mode resonance point and the higher-order mode resonance point of parallel-arm resonator p1 is greater than the frequency interval between the fundamental mode resonance point and the higher-order mode resonance point of series-arm resonator s1. Consequently, a frequency at the higher-order mode resonance occurring point of parallel-arm resonator p1 and a frequency at the higher-order mode resonance occurring point of series-arm resonator s1 can be brought close to each other, and thus attenuation characteristics in a higher-order mode resonance occurring frequency band (an attenuation band higher than the passband) can be improved.

Note that capacitive element C1 and inductor L may be disposed inversely. Specifically, a circuit in which switch SW and capacitive element C1 are connected in series may be connected in parallel to inductor L. According to such a configuration, the directions in which an attenuation pole shifts when switch SW is turned on and off are opposite to filter 10D according to Variation 1.

[1.7.2 Variation 2 of Filter Circuit]

In Embodiment 1 above and Variation 1 thereof, one parallel-arm resonator p1 (the second acoustic wave resonator) is disposed between node x1 and the ground. However, a parallel-arm resonator (a third acoustic wave resonator) different from parallel-arm resonator p1 may be disposed between node x1 and the ground.

Figure 11A:
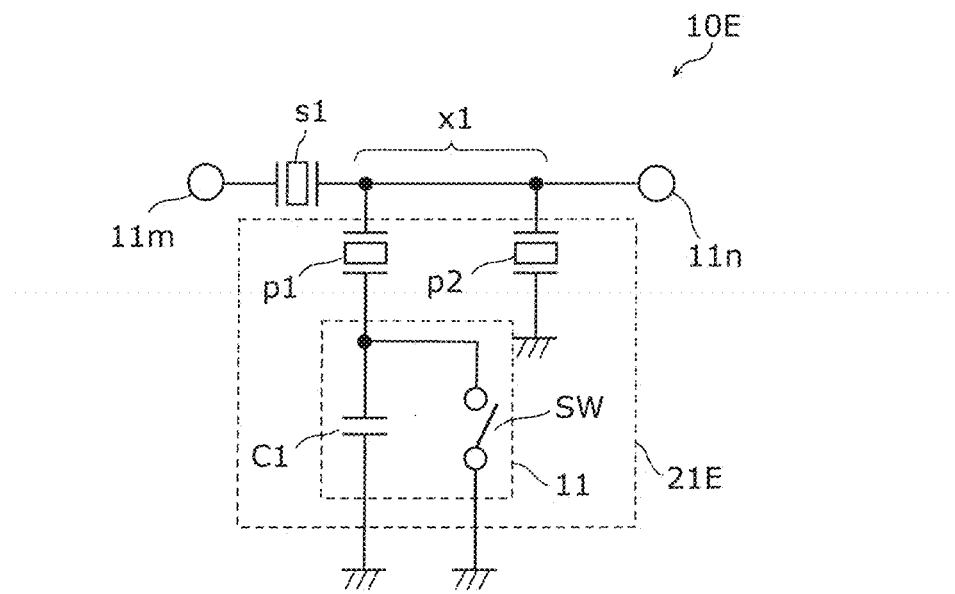
FIG. 11A illustrates a circuit configuration of a filter according to Variation 2 of Embodiment 1.

FIG. 11A illustrates a circuit configuration of filter 10E according to Variation 2 of Embodiment 1.

Filter 10E illustrated in FIG. 11A includes parallel-arm resonant circuit 21E, instead of parallel-arm resonant circuit 21 included in filter 10Z illustrated in FIG. 2A. As compared with parallel-arm resonant circuit 21, parallel-arm resonant circuit 21E further includes parallel-arm resonator p2 (a third acoustic wave resonator) connected between node x1 and the ground, and having a resonant frequency and an antiresonant frequency different from those of parallel-arm resonator p1. Specifically, parallel-arm resonator p1 and parallel-arm resonator p2 are connected to one node x1 on the series arm that connects input/output terminals 11*m* and 11*n*. Accordingly, filter 10E can shift at least one of the frequency of the attenuation pole lower than the passband or the frequency of the attenuation pole higher than the passband. Here, "one node" includes not only a point on the transmission line, but also two different points located on one transmission line without a resonator or an impedance element being provided therebetween.

Specifically, parallel-arm resonator p2 has a resonant frequency and an antiresonant frequency higher than those of parallel-arm resonator p1, and impedance circuit 11 is connected in series to only parallel-arm resonator p1 out of parallel-arm resonator p1 and parallel-arm resonator p2. Specifically, parallel-arm resonator p2 is connected in parallel to a circuit in which parallel-arm resonator p1 and impedance circuit 11 are connected in series.

Parallel-arm resonant circuit 21E having such a configuration has impedance having local minimum values at resonant frequencies of parallel-arm resonators p1 and p2. Specifically, parallel-arm resonant circuit 21E has two resonant frequencies. Parallel-arm resonant circuit 21E has impedance having local maximum values in a frequency band between the two resonant frequencies and in a frequency band higher than the two resonant frequencies. Specifically, parallel-arm resonant circuit 21E has two antiresonant frequencies.

Figure 11B:
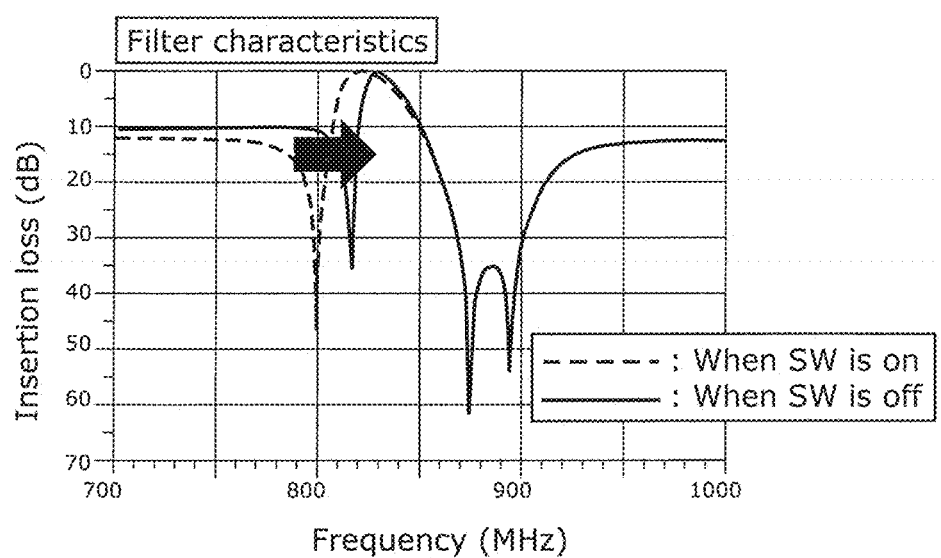
FIG. 11B is a graph illustrating passing characteristics of the filter according to Variation 2 of Embodiment 1.

FIG. 11B is a graph illustrating passing characteristics of filter 10E according to Variation 2 of Embodiment 1. Specifically, FIG. 11B is a graph illustrating a comparison of passing characteristics when switch SW is on and off.

Filter 10E brings the lower antiresonant frequency of the two antiresonant frequencies of parallel-arm resonant circuit 21E and the resonant frequency of a series-arm resonant circuit (series-arm resonator s1 in this variation) close to each other to form a passband.

At this time, in this variation, capacitive element C1 is added to parallel-arm resonator p1 only when switch SW is off. Accordingly, the lower resonant frequency of the two resonant frequencies of parallel-arm resonant circuit 21E shifts to a frequency higher than the resonant frequency of parallel-arm resonator p1 alone when switch SW is turned off. When switch SW is turned off, the lower antiresonant frequency of parallel-arm resonant circuit 21E shifts to a frequency higher than the frequency when switch SW is on. Here, the attenuation pole lower than the passband of filter 10E is determined by the lower antiresonant frequency of parallel-arm resonant circuit 21E. The steepness of the attenuation slope at frequencies lower than the passband is determined by a difference between the lower resonant frequency and the lower antiresonant frequency of parallel-arm resonant circuit 21E. Accordingly, as illustrated in FIG. 11B, filter 10E can shift the passband to higher frequencies by switching switch SW from on to off, without making the slope at frequencies lower than the passband gentle, while shifting the attenuation pole at a frequency lower than the passband to a higher frequency.

In filter 10E described above, protective film 105 of parallel-arm resonator p1 is thinner than protective film 105 of series-arm resonator s1. Accordingly, the frequency interval between the fundamental mode resonance point and the higher-order mode resonance point of parallel-arm resonator p1 is greater than the frequency interval between the fundamental mode resonance point and the higher-order mode resonance point of series-arm resonator s1. Consequently, a frequency at the higher-order mode resonance occurring point of parallel-arm resonator p1 and a frequency at the higher-order mode resonance occurring point of series-arm resonator s1 can be brought close to each other, and thus attenuation characteristics in a higher-order mode resonance occurring frequency band (an attenuation band higher than the passband) can be improved.

[1.7.3 Variation 3 of Filter Circuit]

In Variation 2 of Embodiment 1 above, impedance circuit 11 is connected in series only to parallel-arm resonator p1 out of parallel-arm resonator p1 and parallel-arm resonator p2. However, impedance circuit 11 may be connected in series only to parallel-arm resonator p2 out of parallel-arm resonator p1 and parallel-arm resonator p2.

Specifically, Embodiment 1 and Variations 1 and 2 above have described parallel-arm resonator p1 having a resonant frequency lower than the passband of the filter, as an example of the second acoustic wave resonator connected to capacitive element C1 without having another acoustic wave resonator being provided therebetween. In contrast, this variation describes parallel-arm resonator p2 having a resonant frequency higher than the passband of the filter, as an example of the second acoustic wave resonator.

Figure 12A:
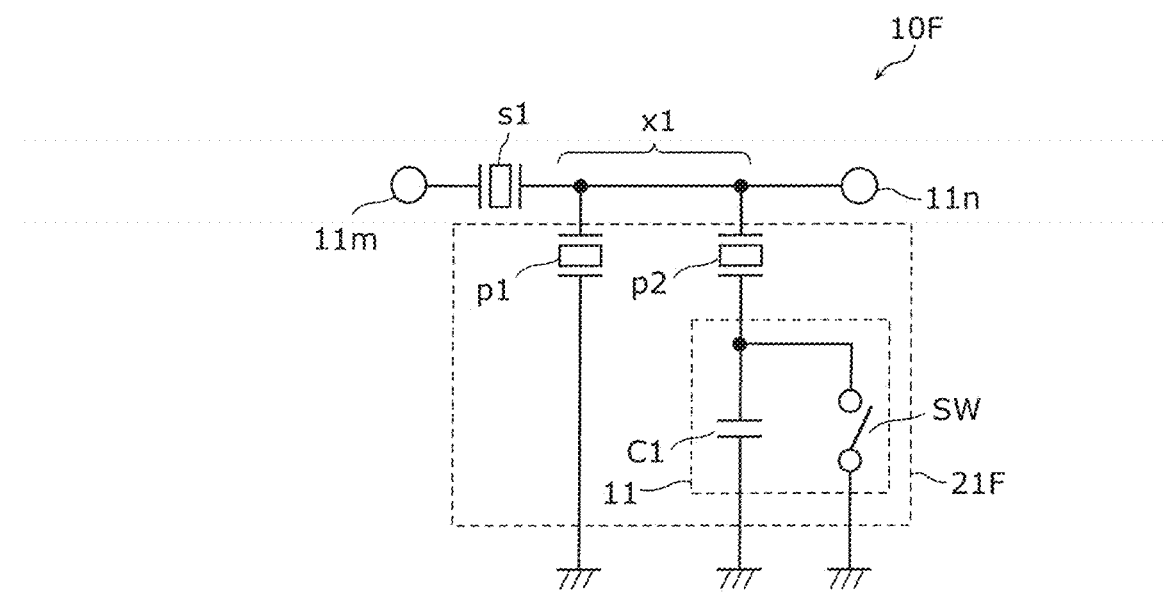
FIG. 12A illustrates a circuit configuration of a filter according to Variation 3 of Embodiment 1.

FIG. 12A illustrates a circuit configuration of filter 10F according to Variation 3 of Embodiment 1.

Filter 10F illustrated in FIG. 12A includes parallel-arm resonant circuit 21F in which impedance circuit 11 is connected in series only to parallel-arm resonator p2 out of parallel-arm resonator p1 and parallel-arm resonator p2, instead of parallel-arm resonant circuit 21E of filter 10E illustrated in FIG. 11A.

Specifically, in this variation, parallel-arm resonator p1 having a resonant frequency and an antiresonant frequency lower than those of parallel-arm resonator p2 (the second acoustic wave resonator) corresponds to a third acoustic wave resonator connected in parallel to parallel-arm resonator p2, and having a resonant frequency and an antiresonant frequency different from those of parallel-arm resonator p2.

Figure 12B:
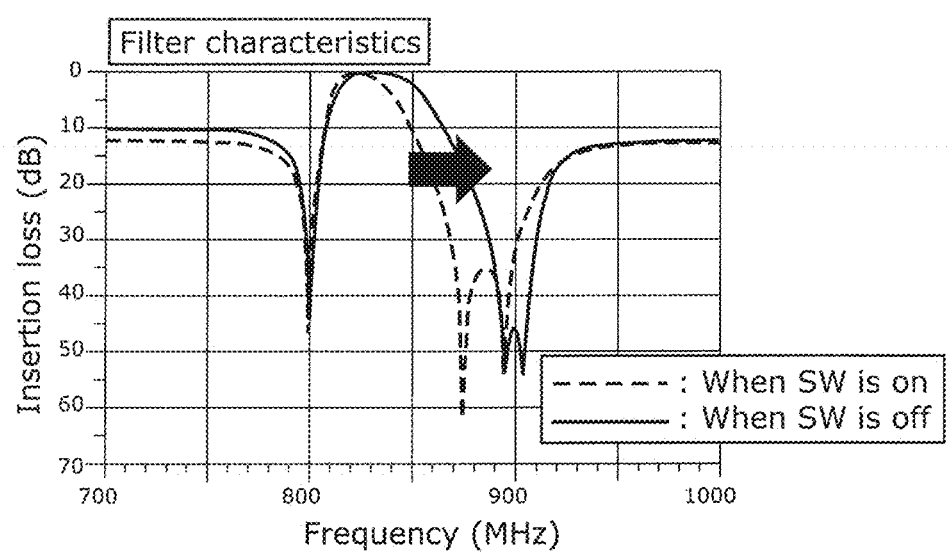
FIG. 12B is a graph illustrating passing characteristics of the filter according to Variation 3 of Embodiment 1.

FIG. 12B is a graph illustrating passing characteristics of filter 10F according to Variation 3 of Embodiment 1. Specifically, FIG. 12B is a graph illustrating a comparison of passing characteristics when switch SW is on and off.

In filter 10F, similarly to filter 10E, the resonant frequency of series-arm resonator s1 and a lower antiresonant frequency out of two antiresonant frequencies of parallel-arm resonant circuit 21F are brought close to each other to form a passband.

At this time, in this variation, capacitive element C1 is added to parallel-arm resonator p2 only when switch SW is off. Accordingly, the higher resonant frequency of the two resonant frequencies of parallel-arm resonant circuit 21F shifts to a frequency higher than the resonant frequency of parallel-arm resonator p2 alone when switch SW is turned off. Further, the lower antiresonant frequency of parallel-arm resonant circuit 21F shifts to a higher frequency when switch SW is turned off than the frequency when switch SW is on. Here, the attenuation pole at a frequency higher than the passband of filter 10F is determined by the higher antiresonant frequency of parallel-arm resonant circuit 21F. The steepness of the attenuation slope at frequencies higher than the passband is determined by a difference between a higher resonant frequency and a lower antiresonant frequency of parallel-arm resonant circuit 21F. Accordingly, as illustrated in FIG. 12B, filter 10F can shift the passband to higher frequencies by switching switch SW from on to off, without making the slope at frequencies lower than the passband gentle, while shifting the attenuation pole at a frequency higher than the passband to a higher frequency.

In filter 10F described above, protective film 105 of parallel-arm resonator p2 is thinner than protective film 105 of series-arm resonator s1. Accordingly, the frequency interval between the fundamental mode resonance point and the higher-order mode resonance point of parallel-arm resonator p2 is greater than the frequency interval between the fundamental mode resonance point and the higher-order mode resonance point of series-arm resonator s1. Accordingly, a frequency at the higher-order mode resonance occurring point of parallel-arm resonator p2 and a frequency at the higher-order mode resonance occurring point of series-arm resonator s1 can be brought close to each other, and thus attenuation characteristics in a higher-order mode resonance occurring frequency band (an attenuation band higher than the passband) can be improved.

[1.7.4 Variation 4 of Filter Circuit]

In Variation 2 of Embodiment 1 above, filter 10E includes impedance circuit 11 connected in series to only parallel-arm resonator p1 out of parallel-arm resonator p1 and parallel-arm resonator p2. In Variation 3 of Embodiment 1 above, filter 10F includes impedance circuit 11 connected in series only to parallel-arm resonator p2 out of parallel-arm resonator p1 and parallel-arm resonator p2. However, the acoustic wave filter may include both of such impedance circuits 11.

Figure 13A:
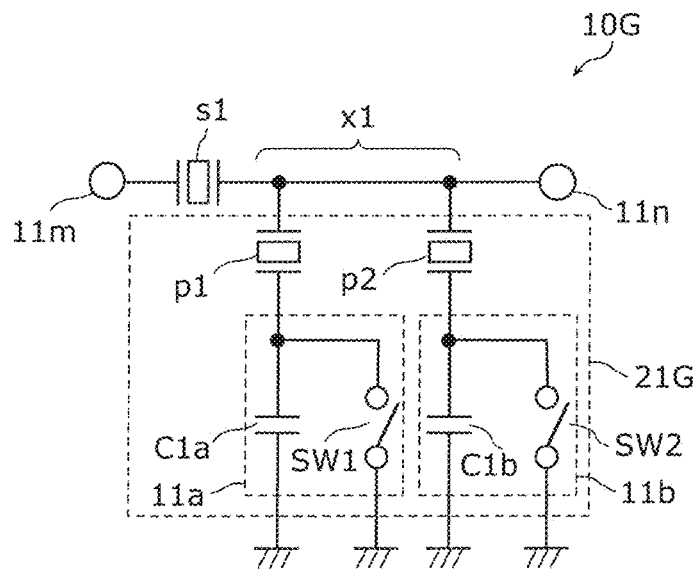
FIG. 13A illustrates a circuit configuration of a filter according to Variation 4 of Embodiment 1.

FIG. 13A illustrates a circuit configuration of filter 10G according to Variation 4 of Embodiment 1.

Filter 10G illustrated in FIG. 13A includes both impedance circuit 11a corresponding to impedance circuit 11 included in filter 10E illustrated in FIG. 11A and impedance circuit 11b corresponding to impedance circuit 11 included in filter 10F illustrated in FIG. 12A. Specifically, parallel-arm resonant circuit 21G in this variation includes impedance circuit 11a connected in series to only one of parallel-arm resonators p1 and p2 (the second acoustic wave resonator and the third acoustic wave resonator), and impedance circuit 11b connected in series to only the other of parallel-arm resonators p1 and p2 (the second acoustic wave resonator and the third acoustic wave resonator).

Figure 13B:
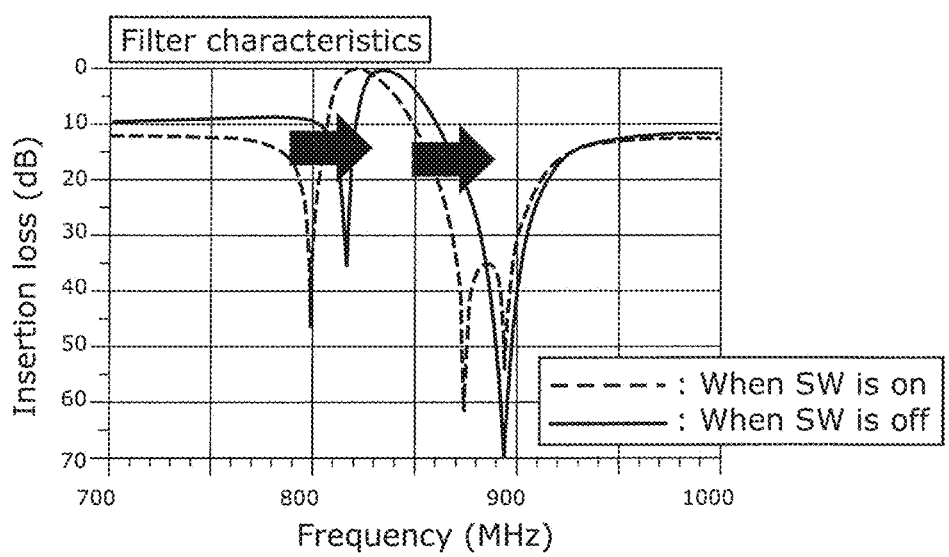
FIG. 13B is a graph illustrating passing characteristics of the filter according to Variation 4 of Embodiment 1.

FIG. 13B is a graph illustrating passing characteristics of filter 10G according to Variation 4 of Embodiment 1. Specifically, FIG. 13B is a graph illustrating a comparison of passing characteristics when switches SW1 and SW2 are both on and both off.

In this variation, capacitive element C1a is added to parallel-arm resonator p1 only when switch SW1 is off. Capacitive element C1b is added to parallel-arm resonator p2 only when switch SW2 is off. Accordingly, the lower resonant frequency of two resonant frequencies of parallel-arm resonant circuit 21G shifts to a frequency higher than the resonant frequency of parallel-arm resonator p1 alone, when switch SW1 is turned off. The higher resonant frequency of the two resonant frequencies of parallel-arm resonant circuit 21G shifts to a frequency higher than the resonant frequency of parallel-arm resonator p2 alone when switch SW2 is turned off. A lower antiresonant frequency of parallel-arm resonant circuit 21G shifts to a higher frequency when at least one of switches SW1 and SW2 is turned off than the frequency when switches SW1 and SW2 are both on.

Accordingly, as illustrated in FIG. 13B, filter 10G can shift the passband to higher frequencies by switching both switches SW1 and SW2 from on to off, without making the slopes at frequencies higher and lower than the passband gentle, while shifting the attenuation poles at frequencies higher and lower than the passband to higher frequencies. Thus, filter 10G can shift the center frequency while maintaining the bandwidth, for example.

Note that from the viewpoint of passing characteristics of the filter, it is preferable that impedance circuits 11a and 11b have capacitive elements C1a and C1b, yet taking into consideration passing characteristics and the size, for instance, that filter 10G are to have, one of impedance circuits 11a and 11b may have, for example, a capacitor stacked on substrate 102 or a variable capacitor such as a variable capacitance diode or a digital tunable capacitor (DTC), instead of a comb-shaped capacitor.

Filter 10G may not turn on or off both switches SW1 and SW2, and may individually turn on or off switches SW1 and SW2. Note that when both switches SW1 and SW2 are turned on and off, the number of control lines for controlling switches SW1 and SW2 can be reduced, and thus the configuration of filter 10G can be simplified.

On the other hand, when switches SW1 and SW2 are individually turned on and off, more variations of passbands that can be switched by filter 10G can be produced.

Specifically, the higher-frequency edge of the passband can be changed according to on and off of switch SW2 connected in series to parallel-arm resonator p2. The lower-frequency edge of the passband can be changed according to on and off of switch SW1 connected in series to parallel-arm resonator p1.

Accordingly, the lower-frequency edge and the higher-frequency edge of the passband can be both shifted to lower frequencies or higher frequencies by turning on or off both switches SW1 and SW2. Thus, the center frequency of the passband can be shifted to a lower or higher frequency. Further, both the lower-frequency edge and the higher-frequency edge of the passband can be shifted to increase or decrease a frequency difference therebetween, by placing one of switches SW1 and SW2 from the on state to the off state and also the other from the off state to the on state. Consequently, the passband width can be changed, while the center frequency of the passband is maintained at a substantially constant frequency. In a state in which one of switches SW1 and SW2 is on or off, the other switch is turned on/off, so that in a state in which one of the lower-frequency edge and the higher-frequency edge of the passband is fixed, the other thereof can be shifted to the lower or higher frequency. Thus, the lower-frequency edge or the higher-frequency edge of the passband can be changed.

Accordingly, filter 10G includes impedance circuit 11a connected in series only to parallel-arm resonator p1 out of parallel-arm resonator p1 and parallel-arm resonator p2, and impedance circuit 11b connected in series only to parallel-arm resonator p2 out of parallel-arm resonator p1 and parallel-arm resonator p2, and thus can increase the flexibility of changing the passband.

In filter 10G described above, protective films 105 of parallel-arm resonators p1 and p2 are thinner than protective film 105 of series-arm resonator sl. Accordingly, the frequency interval between the fundamental mode resonance point and the higher-order mode resonance point of each of parallel-arm resonators p1 and p2 is greater than the frequency interval between the fundamental mode resonance point and the higher-order mode resonance point of series-arm resonator s1. Consequently, the frequencies at the higher-order mode resonance occurring points of parallel-arm resonators p1 and p2 and the frequency at the higher-order mode resonance occurring point of series-arm resonator s1 can be brought close to one another, and thus attenuation characteristics in a higher-order mode resonance occurring frequency band (an attenuation band higher than the passband) can be improved.

[1.7.5 Variation 5 of Filter Circuit]

In Variation 2 of Embodiment 1 above, impedance circuit 11 is connected in series only to parallel-arm resonator p1 out of parallel-arm resonators p1 and p2. In Variation 3 of Embodiment 1 above, impedance circuit 11 is connected in series to only parallel-arm resonator p2 out of parallel-arm resonators p1 and p2. However, impedance circuit 11 may be connected in series to a circuit in which parallel-arm resonator p1 and parallel-arm resonator p2 are connected in parallel.

Figure 14A:
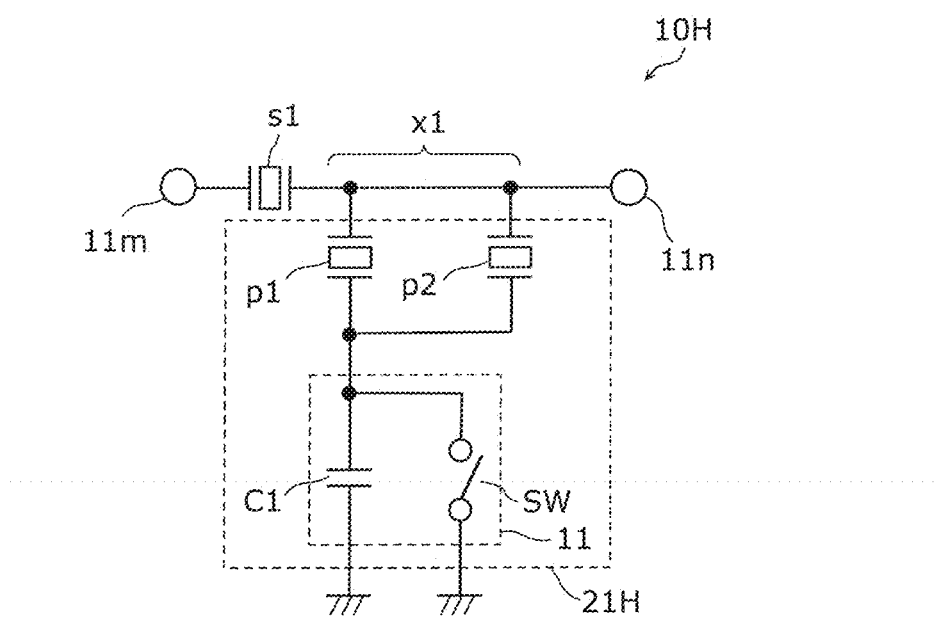
FIG. 14A illustrates a circuit configuration of a filter according to Variation 5 of Embodiment 1.

FIG. 14A illustrates a circuit configuration of filter 10H according to Variation 5 of Embodiment 1.

Filter 10H illustrated in FIG. 14A includes parallel-arm resonant circuit 21H that includes impedance circuit 11 connected in series to a circuit in which parallel-arm resonator p1 and parallel-arm resonator p2 are connected in parallel.

Figure 14B:
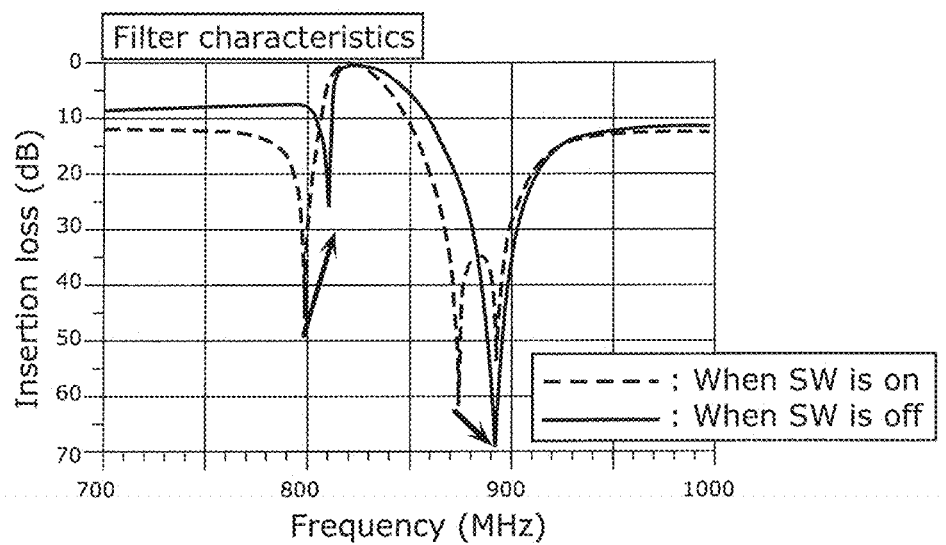
FIG. 14B is a graph illustrating passing characteristics of a tunable filter according to Variation 5 of Embodiment 1.

FIG. 14B is a graph illustrating passing characteristics of filter 10H according to Variation 5 of Embodiment 1. Specifically, FIG. 14B is a graph illustrating a comparison of passing characteristics when switch SW is on and off.

Similar to filter 10E, filter 10H brings a lower antiresonant frequency of two antiresonant frequencies of parallel-arm resonant circuit 21H and a resonant frequency of a series-arm resonant circuit (series-arm resonator s1 in this variation) close to each other to form a passband.

At this time, in this variation, capacitive element C1 is added to both of parallel-arm resonators p1 and p2 only when switch SW is off. Accordingly, the lower resonant frequency of the two resonant frequencies of parallel-arm resonant circuit 21H shifts to a frequency higher than the resonant frequency of parallel-arm resonator p1 alone when switch SW is turned off. Further, the higher resonant frequency of the two resonant frequencies of parallel-arm resonant circuit 21H shifts to a frequency higher than the resonant frequency of parallel-arm resonator p2 alone when switch SW is turned off. Note that a lower antiresonant frequency of parallel-arm resonant circuit 21H does not shift when switch SW is turned off, since impedance circuit 11 is connected in series to a circuit in which parallel-arm resonators p1 and p2 are connected in parallel. Accordingly, as illustrated in FIG. 14B, filter 10H can shift both of the attenuation poles at frequencies higher and lower than the passband to higher frequencies by switching switch SW from on to off.

In filter 10H described above, protective films 105 of parallel-arm resonators p1 and p2 are thinner than protective film 105 of series-arm resonator s1. Accordingly, the frequency interval between the fundamental mode resonance point and the higher-order mode resonance point of each of parallel-arm resonators p1 and p2 is greater than the frequency interval between the fundamental mode resonance point and the higher-order mode resonance point of series-arm resonator s1. The frequencies at the higher-order mode resonance occurring points of parallel-arm resonators p1 and p2 and the frequency at the higher-order mode resonance occurring point of series-arm resonator s1 can be brought close to one another, and thus attenuation characteristics in a higher-order mode resonance occurring frequency band (an attenuation band higher than the passband) can be improved.

Embodiment 2

The present embodiment describes a multiplexer that includes the filter according to Embodiment 1.

Figure 15A:
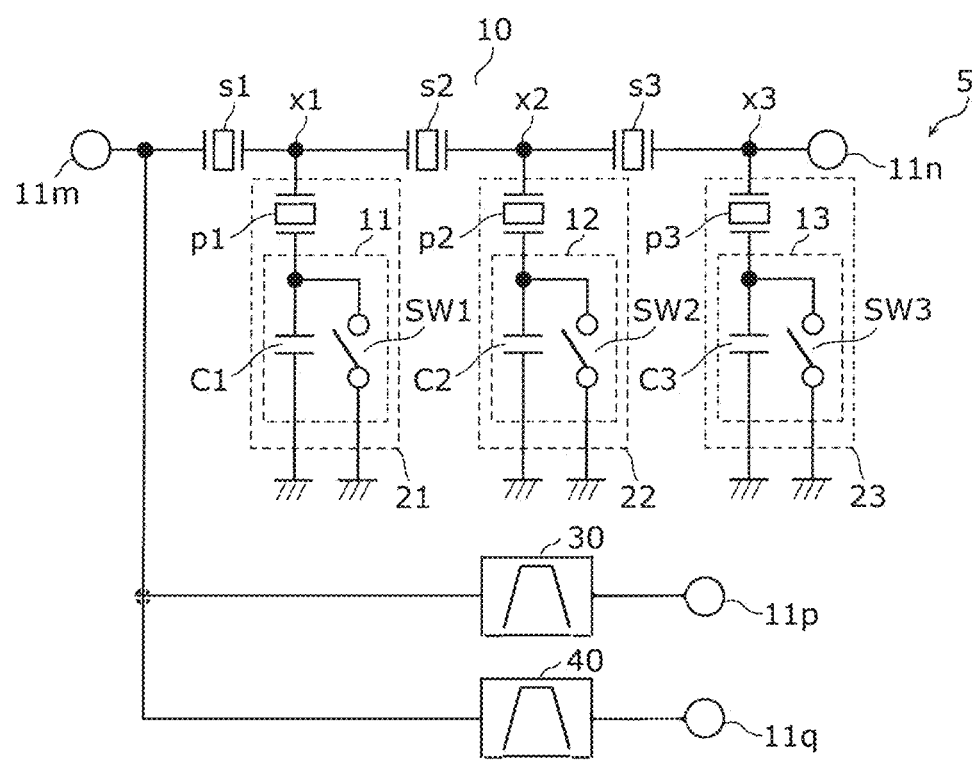
FIG. 15A illustrates a circuit configuration of a multiplexer according to Embodiment 2.
Figure 15B:
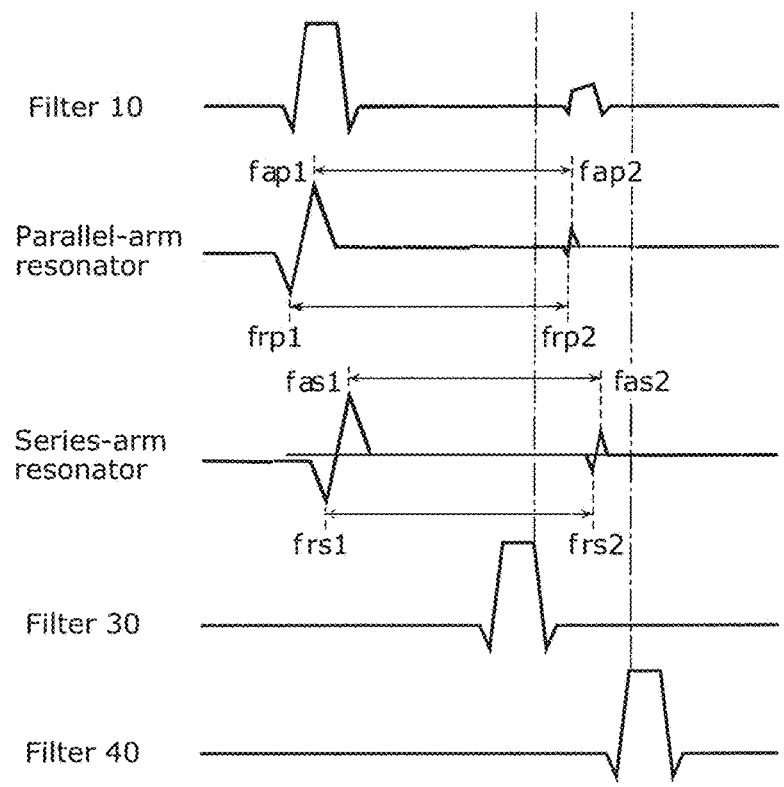
FIG. 15B is a schematic waveform diagram illustrating passing characteristics of filters included in the multiplexer according to Embodiment 2 and impedance characteristics of acoustic wave resonators.

FIG. 15A illustrates a circuit configuration of multiplexer 5 according to Embodiment 2. FIG. 15B is a schematic waveform diagram illustrating passing characteristics of the filters included in multiplexer 5 according to Embodiment 2 and impedance characteristics of acoustic wave resonators. As illustrated in FIG. 15A, multiplexer 5 according to the present embodiment includes filter 10, filter 30, and filter 40.

Filter 10 is filter 10 according to Embodiment 1. Protective films 105 of parallel-arm resonators p1 to p3 of filter 10 are thinner than protective films 105 of series-arm resonators s1 to s3.

Filter 30 is a first filter disposed between input/output terminals 11m and 11p, and as illustrated in FIG. 15B, the frequency range of the passband of filter 30 is higher than the frequency range of the passband of filter 10.

Filter 40 is a second filter disposed between input/output terminals 11m and 11q, and the frequency range of the passband of filter 40 is higher than the frequency range of the passband of filter 30 as illustrated in FIG. 15B.

Filters 10, 30, and 40 are all connected to input/output terminal 11m.

Filter 10 switches the passband between, for example, the receiving band (1475.9 MHz to 1495.9 MHz) of LTE Band 11 and the receiving band (1495.9 MHz to 1510.9 MHz) of Band 21. Filter 30 has a passband that is the receiving band (1805 MHz to 1880 MHz) of Band 3, for example. Filter 40 has a passband that is the receiving band (2110 MHz to 2170 MHz) of Band 1, for example.

Here, wavelength λ, an electrode duty ratio, the thickness of electrode fingers, and the thickness of the protective film of each resonator of filter 10 are set to values that cause higher-order antiresonant frequencies fap2 of parallel-arm resonators p1 to p3 and higher-order resonance frequencies frs2 of series-arm resonators s1 to s3 in filter 10 to be higher than the frequency at the higher-frequency edge of the passband of filter 30. Accordingly, this achieves multiplexer 5 that includes filter 30 having decreased insertion loss in the passband.

Furthermore, wavelength λ, an electrode duty ratio, the thickness of electrode fingers, and the thickness of the protective film of each resonator of filter 10 are set to values that cause higher-order antiresonant frequencies fap2 of parallel-arm resonators p1 to p3 and higher-order resonance frequencies frs2 of series-arm resonators s1 to s3 in filter 10 to be lower than the frequency at the lower-frequency edge of the passband of filter 40. Accordingly, this achieves multiplexer 5 that includes filter 30 having decreased insertion loss in the passband, and filter 40 having decreased insertion loss in the passband.

If the protective films of filter 10 are made thin, the higher-order mode resonance occurring frequency can be increased.

However, the frequency range of the passband of filter 40 (for example, the receiving band of Band 1 (2110 MHz to 2170 MHz)) is greatly distant (for example, by 500 MHz or more) from the frequency range of the passband of filter 10 (for example, the receiving band of Band 21 (1495.9 MHz to 1510.9 MHz)). Accordingly, it is difficult to cause the higher-order mode resonance occurring frequency of filter 10 to be higher than the frequency range of the passband of filter 40. Because, if the protective films are made excessively thin, reliability (environmental resistance performance) decreases, and furthermore, temperature characteristics also deteriorate.

From the above viewpoint, the higher-order mode resonance occurring frequency is adjusted to a frequency between a passband (for example, the receiving band of Band 3 (1805 MHz to 1880 MHz)) of filter 30 having a frequency range comparatively close to the frequency range of the passband of filter 10 and a passband (for example, the receiving band of Band 1 (2110 MHz to 2170 MHz)) of filter 40 having a frequency range distant from the frequency range of the passband of filter 10, thus decreasing insertion loss of filter 30 and insertion loss of filter 40, and maintaining reliability and temperature characteristics of filter 10.

Note that multiplexer 5 according to the present embodiment is configured to include filters 10, 30, and 40, but may have a configuration in which only one of filters 30 and 40 is connected to filter 10. Also, in this case, insertion loss in the passband of one of filters 30 and 40 can be decreased.

Multiplexer 5 according to the present embodiment is configured to include filter 10 according to Embodiment 1, but may be configured to include one of filters 10D to 10H and 10Z that are examples of application of Embodiment 1, instead of filter 10. Also, in this case, multiplexer 5 that includes filters 30 and 40 each having decreased insertion loss in the passband can be achieved.

In multiplexer 5, an impedance matching circuit, a phase shifter, a circulator, and a switch element that can select two or more filters, for instance, may be connected between input/output terminal 11*m* and the three filters. Furthermore, an impedance matching circuit and a switch element, for instance, may be disposed between filter 10 and input/output terminal 11*n*, between filter 30 and input/output terminal 11*p*, and between filter 40 and input/output terminal 11*q*.

Embodiment 3

The filter (the acoustic wave filter) described in Embodiment 1 is applicable to a radio frequency front-end circuit, for instance.

Thus, the present embodiment describes such a radio frequency front-end circuit.

Figure 16:
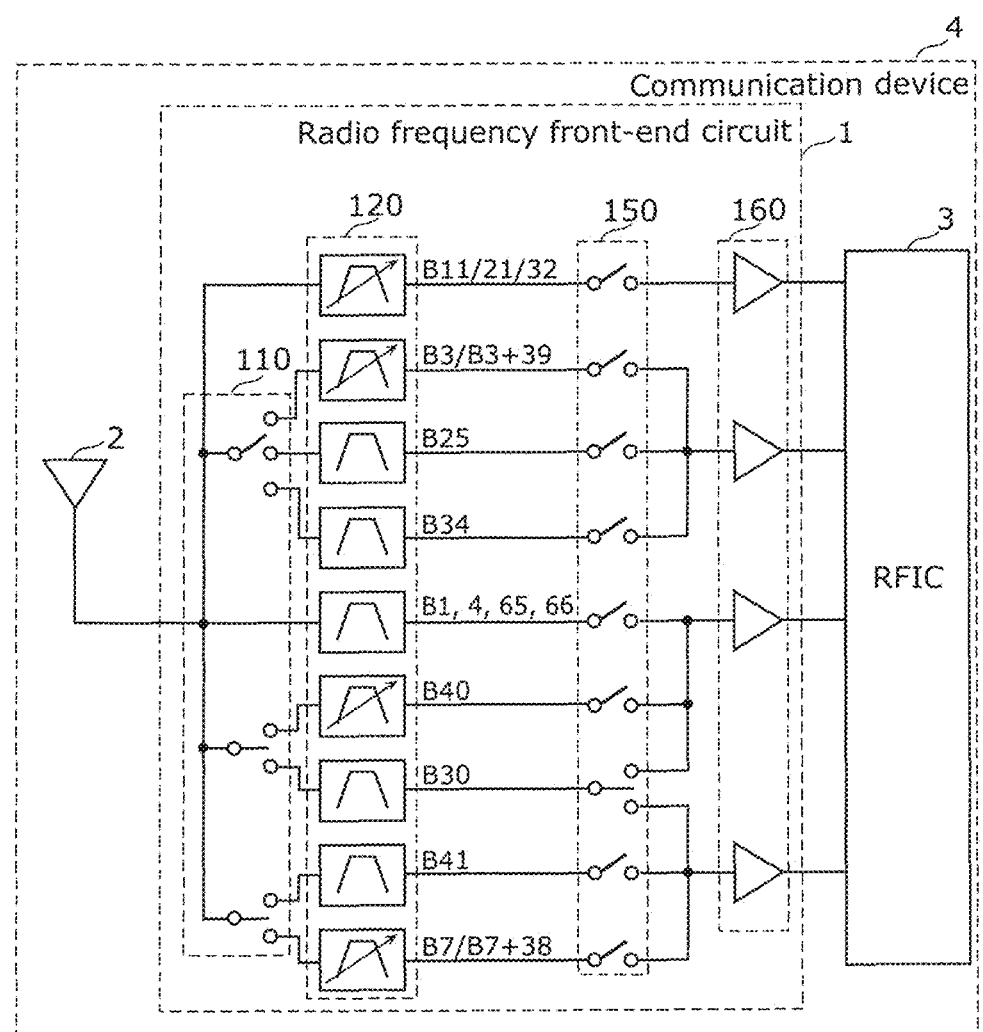
FIG. 16 illustrates a configuration of a radio frequency front-end circuit according to Embodiment 3 and a peripheral circuit thereof.

FIG. 16 illustrates a configuration of radio frequency front-end circuit 1 according to Embodiment 3 and a peripheral circuit thereof. FIG. 16 illustrates radio frequency front-end circuit 1, antenna element 2, and RF signal processing circuit (RFIC) 3. Radio frequency front-end circuit 1, RFIC 3, and antenna element 2 are included in communication device 4. Antenna element 2, radio frequency front-end circuit 1, and RFIC 3 are disposed at, for example, a front end portion of a mobile phone that supports multimode and multiband technology.

Antenna element 2 is, for example, an antenna that transmits and receives radio frequency signals and supports multiband technology, in accordance with the communication standard such as LTE. Note that antenna element 2 may not receive signals of all the bands of communication device 4, for example, and may receive signals of only the bands of a low frequency band group or a high frequency band group. Further, antenna element 2 may not be provided in communication device 4.

RFIC 3 is an RF signal processing circuit that processes radio frequency signals transmitted and received by antenna element 2. Specifically, RFIC 3 processes a radio frequency signal (here, a radio frequency signal received) input through a receiver signal path of radio frequency front-end circuit 1 from antenna element 2 by down-conversion, for instance, and outputs a received signal generated by being processed to a baseband signal processing circuit (not illustrated). RFIC 3 processes a signal to be transmitted input from the baseband signal processing circuit by up-conversion, for instance, and outputs a radio frequency signal (here, a radio frequency signal to be transmitted) generated by being processed to a transmitter signal path (not illustrated) of radio frequency front-end circuit 1.

Radio frequency front-end circuit 1 is a circuit that transfers radio frequency signals between antenna element 2 and RFIC 3. Specifically, radio frequency front-end circuit 1 transfers a radio frequency signal (here, a radio frequency signal to be transmitted) output from RFIC 3, to antenna element 2 through a transmitter signal path (not illustrated). Radio frequency front-end circuit 1 transfers a radio frequency signal (here, a received radio frequency signal) received by antenna element 2, to RFIC 3 through the receiver signal path. The present embodiment describes a configuration in which the filter according to Embodiment 1 is provided on the receiver signal path of radio frequency front-end circuit 1, yet the filter may be provided on the transmitter signal path of radio frequency front-end circuit 1.

Radio frequency front-end circuit 1 includes switch group 110 that includes a plurality of switches, filter group 120 that includes a plurality of filters, switch group 150, and receiving amplifier circuit group 160, from the antenna element 2 side in this order.

Switch group 110 includes one or more switches (a plurality of switches in the present embodiment) that connect antenna element 2 to signal paths for predetermined bands in accordance with a control signal from the controller (not illustrated). Note that the number of signal paths connected to antenna element 2 is not limited to one and may be two or more. Specifically, radio frequency front-end circuit 1 may support carrier aggregation.

Filter group 120 includes one or more filters, and includes a plurality of filters as follows, for example, in the present embodiment.

Specifically, the filters are (i) a tunable filter for Bands 11, 21 and 32, (ii) a tunable filter for Band 3, which supports carrier aggregation (CA) of Bands 3 and 9, (iii) a filter for Band 25, (iv) a filter for Band 34, (v) a filter for Bands 1, 4, 65, and 66, (vi) a tunable filter for Band 40, (vii) a filter for Band 30, (viii) a filter for Band 41, and (ix) a tunable filter for Band 7, which supports CA of Bands 7 and 38.

Switch group 150 includes one or more switches (a plurality of switches in the present embodiment) that connect a signal path for a predetermined band to a receiving amplifier circuit for the predetermined band in receiving amplifier circuit group 160, in accordance with a control signal from the controller (not illustrated). Note that the number of signal paths connected to antenna element 2 is not limited to one and may be two or more. Specifically, radio frequency front-end circuit 1 may support carrier aggregation. Accordingly, a radio frequency signal (here, a received radio frequency signal) input from antenna element 2 passes through a predetermined filter in filter group 120, is amplified by a predetermined receiving amplifier circuit in receiving amplifier circuit group 160, and is output to RFIC 3. Note that an RFIC for a low band and an RFIC for a high band may be provided individually.

Receiving amplifier circuit group 160 includes one or more low-noise amplifiers (a plurality of low-noise amplifiers in the present embodiment) that amplify power of radio frequency reception signals input from switch group 150.

Radio frequency front-end circuit 1 having such a configuration includes one of filters 10, 10D to 10H, and 10Z in the examples of application of Embodiment 1, as at least one tunable filter. According to this, attenuation characteristics at frequencies higher than the passband can be improved, and as compared to the case where a filter is provided for each band, the number of filters is less and thus the radio frequency front-end circuit can be miniaturized.

Other Embodiments

The above has described the acoustic wave filter, the multiplexer, and the radio frequency front-end circuit according to the present disclosure, using Embodiments 1 to 3, yet the present disclosure is not limited to the above embodiments. The present disclosure also encompasses another embodiment achieved by combining arbitrary elements in the above embodiments, variations as a result of applying, to the embodiments, various modifications that may be conceived by those skilled in the art without departing from the scope of the present disclosure, and various devices that include the acoustic wave filter, the multiplexer, and the radio frequency front-end circuit according to the present disclosure.

For example, communication device 4 that includes radio frequency front-end circuit 1 and RFIC 3 (the RF signal processing circuit) described above is also encompassed in the present disclosure. According to such communication device 4, the attenuation characteristics at frequencies higher than the passband can be improved.

A multiplexer such as a duplexer that includes the filter as described above is also encompassed in the present disclosure. Thus, in the multiplexer in which a plurality of filters are connected, at least one of the filters may be one of the filters described above.

Out of the acoustic wave resonators included in the filter, at least one of one or more acoustic wave resonators other than an acoustic wave resonator (the second acoustic wave resonator) connected to a comb-shaped capacitor without another acoustic wave resonator being provided therebetween may be an acoustic wave resonator that uses bulk waves or boundary acoustic waves.

For example, circuit elements such as inductors and capacitors may be connected between elements in the acoustic wave filter, the radio frequency front-end circuit, and the communication device described above. Note that the inductor may include a line inductor achieved by a line that connects elements.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure may be widely used in communication apparatuses such as mobile phones, as a filter, a multiplexer, a front-end circuit, and a communication device that have excellent attenuation characteristics at higher frequencies.

The invention claimed is:
1. An acoustic wave filter, comprising:
a series-arm resonant circuit that includes a first acoustic wave resonator, the series-arm resonant circuit being disposed on a first path that conveys radio-frequency (RF) signals between a first input/output terminal and a second input/output terminal; and
a parallel-arm resonant circuit that includes a second acoustic wave resonator, the parallel-arm resonant circuit being disposed on a second path that connects a node on the first path and a ground,
wherein the first acoustic wave resonator and the second acoustic wave resonator each include:
an interdigital transducer (IDT) electrode formed on a substrate and including a plurality of electrode fingers, the substrate being at least partially piezoelectric; and
a protective film that covers the IDT electrode,
the protective film in the second acoustic wave resonator being thinner than the protective film in the first acoustic wave resonator,
the first acoustic wave resonator having a higher-order mode resonance frequency and a higher-order mode antiresonant frequency that are higher than an antiresonant frequency of the first acoustic wave resonator,
the second acoustic wave resonator having a higher-order mode resonance frequency and a higher-order mode antiresonant frequency that are higher than an antiresonant frequency of the second acoustic wave resonator, and under a condition that a value obtained by dividing a difference between a higher-order mode resonance frequency and a resonant frequency of a particular acoustic wave resonator by the resonant frequency of the particular acoustic wave resonator is defined as a first fractional bandwidth, and a. value obtained by dividing a difference between a higher-order mode antiresonant frequency and an antiresonant frequency of the particular acoustic wave resonator by the antiresonant frequency of the particular acoustic wave resonator is defined as a second fractional bandwidth, a first fractional bandwidth of the second acoustic wave resonator is greater than a first fractional bandwidth of the first acoustic wave resonator, and a second fractional bandwidth of the second acoustic wave resonator is greater than a second fractional bandwidth of the first acoustic wave resonator.

2. The acoustic wave filter according to claim 1, wherein the parallel-arm resonant circuit further includes an impedance circuit configured to controllably change a passband of the acoustic wave filter, the impedance circuit being connected to the second acoustic wave resonator, and the impedance circuit includes:
  a capacitive element connected to the second acoustic wave resonator; and
  a switch element connected in parallel to the capacitive element, between the second acoustic wave resonator and the ground.

3. The acoustic wave filter according to claim 2, wherein the parallel-arm resonant circuit further includes a third acoustic wave resonator, and the impedance circuit is connected in series to a circuit including the second acoustic wave resonator and the third acoustic wave resonator that are connected in parallel.

4. The acoustic wave filter according to claim 2, wherein the impedance circuit further includes an inductor connected in series to the switch element, and a circuit in which the switch element and the inductor are connected in series is connected in parallel to the capacitive element.

5. The acoustic wave filter according to claim 2, wherein the parallel-arm resonant circuit further includes a third acoustic wave resonator, the third acoustic wave resonator being connected, between the node and the ground, in parallel to a circuit in which the second acoustic wave resonator and the impedance circuit are connected in series, and the third acoustic wave resonator having a resonant frequency different from the resonant frequency of the second acoustic wave resonator, and an antiresonant frequency different from the antiresonant frequency of the second acoustic wave resonator.

6. The acoustic wave filter according to claim 5, wherein the resonant frequency of the third acoustic wave resonator is lower than the resonant frequency of the second acoustic wave resonator, the antiresonant frequency of the third acoustic wave resonator being lower than the antiresonant frequency of the second acoustic wave resonator, and the impedance circuit being connected in series to the second acoustic wave resonator but not the third acoustic wave resonator.

7. The acoustic wave filter according to claim 5, wherein the resonant frequency of the third acoustic wave resonator is higher than the resonant frequency of the second acoustic wave resonator, the antiresonant frequency of the third acoustic wave resonator being higher than the antiresonant frequency of the second acoustic wave resonator, and the impedance circuit being connected in series to the second acoustic wave resonator but not the third acoustic wave resonator.

8. The acoustic wave filter according to claim 5, wherein the parallel-arm resonant circuit further includes, between the node and the ground, another impedance circuit connected in series to the third acoustic wave resonator.

9. The acoustic wave filter according to claim 1, wherein a difference between the higher-order mode antiresonant frequency of the first acoustic wave resonator and the higher-order mode resonance frequency of the second acoustic wave resonator is smaller than a difference between the antiresonant frequency of the first acoustic wave resonator and the resonant frequency of the second acoustic wave resonator.

10. The acoustic wave filter according to claim 9, wherein the parallel-arm resonant circuit further includes an impedance circuit configured to controllably change a passband of the acoustic wave filter, the impedance circuit being connected to the second acoustic wave resonator, and the impedance circuit includes:
  a capacitive element connected to the second acoustic wave resonator; and
  a switch element connected in parallel to the capacitive element, between the second acoustic wave resonator and the ground.

11. The acoustic wave filter according to claim 10, wherein the parallel-arm resonant circuit further includes a third acoustic wave resonator, and the impedance circuit is connected in series to a circuit including the second acoustic wave resonator and the third acoustic wave resonator that are connected in parallel.

12. The acoustic wave filter according to claim 10, wherein the impedance circuit further includes an inductor connected in series to the switch element, and a circuit in which the switch element and the inductor are connected in series is connected in parallel to the capacitive element.

13. The acoustic wave filter according to claim 10, wherein the parallel-arm resonant circuit further includes a third acoustic wave resonator, the third acoustic wave resonator being connected, between the node and the ground, in parallel to a circuit in which the second acoustic wave resonator and the impedance circuit are connected in series, and the third acoustic wave resonator having a resonant frequency different from the resonant frequency of the second acoustic wave resonator, and an antiresonant frequency different from the antiresonant frequency of the second acoustic wave resonator.

14. The acoustic wave filter according to claim 13, wherein the resonant frequency of the third acoustic wave resonator is lower than the resonant frequency of the second acoustic wave resonator, the antiresonant frequency of the third acoustic wave resonator is lower than the antiresonant frequency of the second acoustic wave resonator, and the impedance circuit being connected in series to the second acoustic wave resonator but not the third acoustic wave resonator.

15. The acoustic wave filter according to claim 13, wherein the resonant frequency of the third acoustic wave resonator is higher than the resonant frequency of the second acoustic wave resonator,
the antiresonant frequency of the third acoustic wave resonator is higher than the anti resonant frequency of the second acoustic wave resonator, and
the impedance circuit being connected in series to the second acoustic wave resonator but not the third acoustic wave resonator.

16. The acoustic wave filter according to claim 13, wherein
the parallel-arm resonant circuit further includes, between the node and the ground, another impedance circuit connected in series to the third acoustic wave resonator.

17. A multiplexer, comprising:
an acoustic wave filter including
  a series-arm resonant circuit that includes a first acoustic wave resonator, the series-arm resonant circuit being disposed on a first path that conveys radio-frequency (RF) signals between a first input/output terminal and a second input/output terminal;
  a parallel-arm resonant circuit that includes a second acoustic wave resonator, the parallel-arm resonant circuit being disposed on a second path that connects a node on the first path and a ground; and
  a first filter connected to the first input/output terminal,
wherein the first acoustic wave resonator and the second acoustic wave resonator each include:
  an interdigital transducer (IDT) electrode formed on a substrate and including a plurality of electrode fingers, the substrate being at least partially piezoelectric; and
  a protective film that covers the IDT electrode,
the protective film in the second acoustic wave resonator being thinner than the protective film in the first acoustic wave resonator,
the first acoustic wave resonator having a higher-order mode resonance frequency and a higher-order mode antiresonant frequency that are higher than an antiresonant frequency of the first acoustic wave resonator,
the second acoustic wave resonator having a higher-order mode resonance frequency and a higher-order mode antiresonant frequency that are higher than an antiresonant frequency of the second acoustic wave resonator, and
under a condition that a value obtained by dividing a difference between a higher-order mode resonance frequency and a resonant frequency of a particular acoustic wave resonator by the resonant frequency of the particular acoustic wave resonator is defined as a first fractional bandwidth, and a value obtained by dividing a difference between a higher-order mode antiresonant frequency and an antiresonant frequency of the particular acoustic wave resonator by the antiresonant frequency of the particular acoustic wave resonator is defined as a second fractional bandwidth,
  a first fractional bandwidth of the second acoustic wave resonator is greater than a first fractional bandwidth of the first acoustic wave resonator, and
  a second fractional bandwidth of the second acoustic wave resonator is greater than a second fractional bandwidth of the first acoustic wave resonator; and wherein a passband of the first filter has a frequency range at least partially higher than a frequency range of a passband of the acoustic wave filter, and
the higher-order mode resonance frequency of the first acoustic wave resonator and the higher-order mode antiresonant frequency of the second acoustic wave resonator are higher than a frequency at a higher-frequency edge of the passband of the first filter.

18. The multiplexer according to claim 17, further comprising:
a second filter connected to the first input/output terminal,
wherein a passband of the second filter has a frequency range at least partially higher than the frequency range of the passband of the first filter, and
the higher-order mode resonance frequency of the first acoustic wave resonator and the higher-order mode antiresonant frequency of the second acoustic wave resonator are lower than a frequency at a lower-frequency edge of the passband of the second filter.

19. A radio frequency front-end circuit, comprising:
an acoustic wave filter including
  a series-arm resonant circuit that includes a first acoustic wave resonator, the series-arm resonant circuit being disposed on a first path that conveys radio-frequency (RF) signals between a first input/output terminal and a second input/output terminal, and
  a parallel-arm resonant circuit that includes a second acoustic wave resonator, the parallel-arm resonant circuit being disposed on a second path that connects a node on the first path and a ground; and
an amplifier circuit connected to the acoustic wave filter,
wherein the first acoustic wave resonator and the second acoustic wave resonator each include:
  an interdigital transducer (IDT) electrode formed on a substrate and including a plurality of electrode fingers, the substrate being at least partially piezoelectric; and
  a protective film that covers the IDT electrode,
the protective film in the second acoustic wave resonator being thinner than the protective film in the first acoustic wave resonator,
the first acoustic wave resonator having a higher-order mode resonance frequency and a higher-order mode antiresonant frequency that are higher than an antiresonant frequency of the first acoustic wave resonator,
the second acoustic wave resonator having a higher-order mode resonance frequency and a higher-order mode antiresonant frequency that are higher than an antiresonant frequency of the second acoustic wave resonator, and
under a condition that a value obtained by dividing a difference between a higher-order mode resonance frequency and a resonant frequency of a particular acoustic wave resonator by the resonant frequency of the particular acoustic wave resonator being defined as a first fractional bandwidth, and a value: obtained by dividing a difference between a higher-order mode antiresonant frequency and an antiresonant frequency of the particular acoustic wave resonator by the antiresonant frequency of the particular acoustic wave resonator is defined as a second fractional bandwidth,
  a first fractional bandwidth of the second acoustic wave resonator is greater than a first fractional bandwidth of the first acoustic wave resonator, and
  a second fractional bandwidth of the second acoustic wave resonator is greater than a second fractional bandwidth of the first acoustic wave resonator.

20. A communication device, comprising:
- a radio frequency (RF) signal processing circuit configured to process a radio frequency signal to be transmitted by an antenna element and a radio frequency signal received by the antenna element; and
- the radio frequency front-end circuit according to claim 19 configured to transfer the radio frequency signals between the antenna element and the RF signal processing circuit.

* * * * *